US007165200B2

(12) United States Patent
Jani et al.

(10) Patent No.: US 7,165,200 B2
(45) Date of Patent: Jan. 16, 2007

(54) SYSTEM AND METHOD FOR CHARACTERIZING A SIGNAL PATH USING A SUB-CHIP SAMPLER

(75) Inventors: Nilay D. Jani, Salt Lake City, UT (US);
Anurag Nigam, Aurangabad (IN);
Cynthia M. Furse, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 11/124,458

(22) Filed: May 5, 2005
(Under 37 CFR 1.47)

(65) Prior Publication Data
US 2005/0289408 A1    Dec. 29, 2005

Related U.S. Application Data

(63) Continuation-in-part of application No. PCT/US04/03343, filed on Feb. 4, 2004.

(60) Provisional application No. 60/569,448, filed on May 6, 2004.

(51) Int. Cl.
*G01R 31/28* (2006.01)
(52) U.S. Cl. .................. 714/724; 714/728; 714/738

(58) Field of Classification Search ............... 714/724, 714/728, 738
See application file for complete search history.

(56) References Cited

U.S. PATENT DOCUMENTS

| | | | |
|---|---|---|---|
| 3,947,634 A * | 3/1976 | Betts | 375/367 |
| 4,017,798 A | 4/1977 | Gordy et al. | |
| 6,294,936 B1 * | 9/2001 | Clementi | 327/156 |
| 6,317,452 B1 | 11/2001 | Durrant et al. | |
| 6,665,358 B1 | 12/2003 | Odagiri | |
| 6,801,569 B1 | 10/2004 | Yang | |

\* cited by examiner

*Primary Examiner*—Phung My Chung
(74) *Attorney, Agent, or Firm*—Thorp North & Western LLP

(57) ABSTRACT

A system and method are disclosed for characterizing a signal path. The system includes a system clock configured to produce a system clock signal at a sample frequency. A frequency divider is configured to divide the sample frequency of the system clock signal by a factor of N to produce a chip clock signal at a chip frequency. The system further includes a pseudo-noise (PN) sequence generator configured to produce a PN sequence at the chip frequency and couple the PN sequence to the signal path while the signal path is carrying an operational signal. A sub-chip sampler is configured to correlate the PN sequence and a reflected PN sequence which has been reflected within the signal path to form a correlated signal and to sample the correlated signal at the sample frequency of the system clock signal.

24 Claims, 21 Drawing Sheets

Delay    2* Delay    3* Delay

SYSTEM AND METHOD FOR CHARACTERIZING A SIGNAL PATH USING A SUB-CHIP SAMPLER

CROSS-REFERENCE TO RELATED APPLICATIONS AND CLAIM OF PRIORITY

This is a continuation-in-part of PCT patent application Ser. No. PCT/US2004/003343 filed on Feb. 4, 2004 which is incorporated herein by reference in its entirety. Priority of U.S. Provisional patent application Ser. No. 60/569,448 filed on May 6, 2004 is also claimed.

FIELD OF THE INVENTION

The present invention relates generally to the analysis of signal paths. More particularly, the present invention relates to methods and apparatus for the analysis of signal paths using time domain reflectometry and related methods.

BACKGROUND

Complex electrical wiring networks, often having "branched circuits", are extremely common in aircraft, ships, trains, large refineries and factories, homes, electronic equipment, etc. Often these wiring networks are installed and expected to work for the lifetime of the building or vehicle. The wiring networks are tested only if they no longer work. There is currently a lack of an effective, small and efficient sensor to precisely detect and locate electrical faults in a wiring network. The manpower and time required to manually check large and complex wiring networks can be considerable. In critical systems, such as aircraft, there is a need to detect and locate faults before a wiring network decays to the point of failure.

In the past few years there has been significant effort to develop sensors for locating wiring faults. Several sensor methods were developed that can locate the faults in dead (un-powered) wires. But many faults occur intermittently during an aircraft's flight, and are undetectable on the ground. These "no fault found" conditions are capable of bringing an aircraft down by causing a fire. In order to reduce the risk of these fires, arc fault circuit interrupters (AFCI) breakers have been developed and are being readied for large-scale implementation on aircraft power circuits. These breakers are designed to trip when a small arc occurs, dramatically reducing the risk of fire. The AFCI breaker can cause a maintenance enigma, however. Where traditional circuit breakers trip when damage to the wire is large and generally visible, the AFCI breakers trip when damage to wire is tiny and the wires are often otherwise fully functional. Finding this tiny damage can be difficult or impossible, especially where wiring is located in difficult to access areas.

Time domain reflectometry (TDR) has been used to analyze the path of signals in dead wires. However, when a system is active, such as an aircraft in flight, traditional TDR typically isn't used for active wiring having signals as the TDR signal and the wire signal can interfere with each other.

SUMMARY

A system and method are disclosed for characterizing a signal path. The system includes a system clock configured to produce a system clock signal at a sample frequency. A frequency divider is configured to divide the sample frequency of the system clock signal by a factor of N to produce a chip clock signal at a chip frequency. The system further includes a pseudo-noise (PN) sequence generator configured to produce a PN sequence at the chip frequency and couple the PN sequence to the signal path while the signal path is carrying an operational signal. A sub-chip sampler is configured to correlate the PN sequence and a reflected PN sequence which has been reflected within the signal path to form a correlated signal and to sample the correlated signal at the sample frequency of the system clock signal.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

Figure 1:
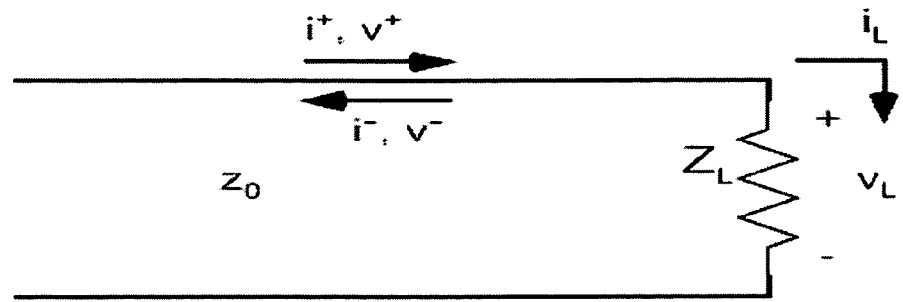
FIG. 1 is a diagram of transmitted and reflected voltages and currents on the wire under test in accordance with an embodiment of the present invention.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENT(S)

Various sensor systems exist for fault location on aircraft wiring. These systems can be classified under sensor families by the principle they use for fault localization. Various sensor families are: Capacitance/Inductance methods, Time Domain Reflectometry (TDR), Frequency Domain Reflectometry (FDR) and Spread Spectrum Reflectometry. The capacitance/inductance methods measure bulk capacitance and inductance of wire. Time domain reflectometry (TDR) uses a pulse as the test signal and measures the reflection of the same. Frequency domain reflectometry (FDR) uses sine waves as test signals and multiplies the reflected signal with a copy of the transmitted signal to extract the time delay in the reflected signal. Spread Spectrum methods use Pseudo Noise (PN) sequences as test signals and cross correlate reflected signals with the transmitted PN sequence in order to locate faults.

Capacitance/inductance methods, TDR and FDR methods send or use test signals on the wire that are above the noise margin of the signal present on wire. Thus, these methods cannot be used for fault location on live wires. Spread spectrum systems can be used to locate faults on live wires, as the PN sequences are below the noise margin of the signal present on the wire, and thus do not interfere with the signal on the wire. The capacitance/inductance methods and FDR can be used to locate large faults only. They cannot locate small arcs. TDR and Spread Spectrum methods can be used to locate small arcs. One unresolved issue with all sensor systems is the branched wiring problem. In branched wiring networks the junction of branches may look like faults. The challenge is to distinguish between junctions and the discontinuity, to locate junctions and map the wiring network in order to localize the faults in the network and to resolve ambiguities in order to map the network successfully. The design in this application also lends itself to expansion for analysis of branched networks.

Sensing Dead Wires

Several sensors have been developed for locating faults on dead wires. The major methods are visual inspection, time domain reflectometry (TDR), frequency domain reflectometry (FDR), mixed signal reflectometry (MSR), capacitance sensors and resistance sensors.

Visual Inspection

Today's most widely used method for locating faults on wires is visual inspection, where the wiring is fully exposed, and a flashlight and mirror are used to visually seek faults. Not only does visual inspection take an exhaustive amount of time, but it is also only effective for locating damage that is clearly visible. While this has been limited in its effectiveness for years, the problem is now being exacerbated by the use of new Arc Fault Circuit Interrupters (AFCI) that trip on arcs when damage to wires can be very slight. Although likely to be a tremendous boon for safety, this leaves the maintainers with a plane on the ground and a nearly invisible fault buried somewhere in the body of the aircraft. Wires are generally fully functional, and the damage is very hard to see. Also when wiring is bundled or shielded or in places unreachable by humans, the damage is impossible to locate with this method.

Resistance Meters

Resistance meters (also known as continuity testers) are one of the simplest ways to detect faults in wires. This method exploits Ohm's law V=IR. This method requires access to both ends of the wires, which is difficult in most of cases. This method cannot pinpoint the location of a fault on a network of wires, because this method does not detect the location of resistance change, however a variant method, the 4-wire test method can in some cases. These methods are not suitable for live wires.

Capacitance Meters

Capacitance meters measure the bulk capacitance of the line in the case of an open circuited wire or the inductance of the wire in the case of a short-circuited wire. The inductance and capacitance are linearly proportional to wire length.

Although capacitance meters are one of the simplest techniques to identify the fault on wire, they cannot be used on live wires. The fault location cannot be localized in a network of wires using capacitance meters, since bulk capacitance and inductance are being measured. For short-circuited wires especially, the inductance being measured is highly susceptible to nearby structures, wires, etc.

Time Domain Reflectometry (TDR)

Time domain Reflectometry (TDR) has been used experimentally to locate faults on all kinds of wires. TDR locates impedance changes in the wire.

In TDR a voltage pulse or step is sent down the wire. Voltage and current waveforms travel in the wire according to electric and magnetic fields defined by Maxwell's equations. When the voltage and current waves reach a discontinuity in the impedance of the wire, they will reflect according equation 2.1.

$$\frac{V_{ref}}{V_{incident}} = \Gamma = \frac{Z_0 - Z_L}{Z_0 + Z_L} \quad (2.1)$$

As shown in FIG. 1, the waves travel along the wire of characteristic impedance $Z_0$ and hits the discontinuity caused by a fault with impedance $Z_L$. The $\Gamma^*V$ part of the signal reflects back, and the rest is transmitted. The magnitude of the reflected voltage helps us to determine the type and magnitude of the discontinuity or fault.

The location of the discontinuity can be determined by the time it takes for the reflected signal to reach the testing end. The return time is proportional to the phase velocity of the signal in the wire. The time is directly related to the length traveled by the signal with that phase velocity. The distance of the discontinuity from the testing end can be determined from this return time.

TDR method is not ideal for use on live wires. In some cases where the wire is carrying a low frequency signal, TDR may be used live, however it is not noise immune and therefore is susceptible to noise and contamination of the signal.

Spread Spectrum Sensors

Spread Spectrum Reflectometry (SSR) sensors use a pseudo noise (PN) sequence as the measurement signal. An emerging sensor, Noise Domain Reflectometry (NDR), uses noise present on the wire as the measurement signal. Both of these systems rely on the large bandwidth of the test signal to enable accurate measurement. In case of SSR, the PN-sequences are below the noise level of the wire, so they do not interfere with the data or power signals already on the live wire. Thus, these sensors enable us to test live wires carrying operational signals. The live wire sensor methods using a PN sequence include Sequence Time Domain Reflectometry (STDR) and Spread Spectrum Time Domain Reflectometry (SSTDR). Noise Domain Reflectometry (NDR) can also be used to test live wires, as it does not impose any signal on the test wire.

Sequence Time Domain Reflectometry (STDR)

Sequence Time Domain Reflectometry (STDR) tests the wire using a pseudo noise (PN) sequence. The PN sequence is sent down the wire and reflects from discontinuities on the wire with a phase delay proportional to the distance of discontinuity. The information about the discontinuity can be recovered from the reflected signal by performing the cross-correlation between the transmitted and received signals. A basic block diagram of the STDR/SSTDR system is given in FIG. 2.

Figure 2:
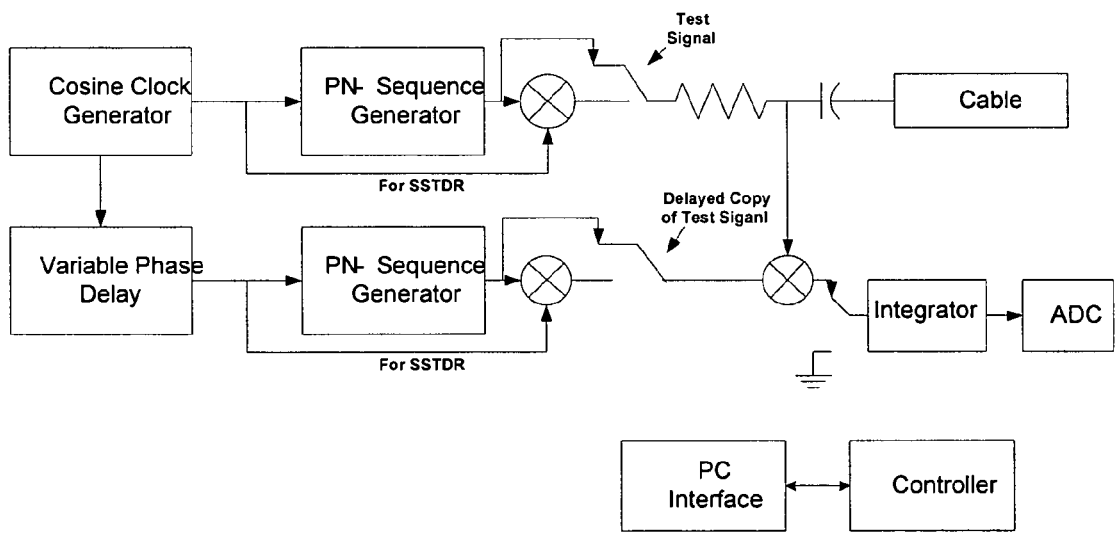
FIG. 2 is a block diagram of the STDR/SSTDR system in accordance with an embodiment of the present invention.
Figure 3:
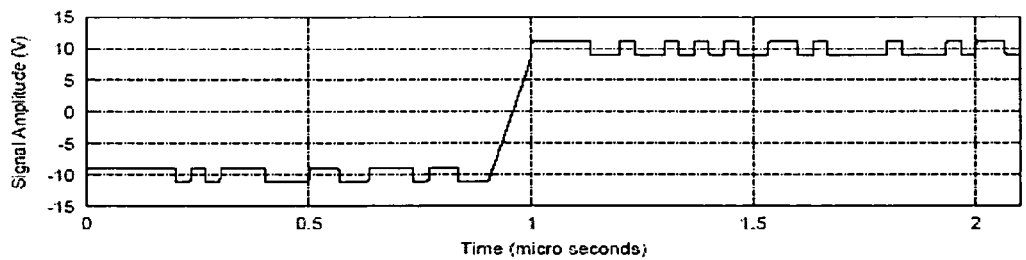
FIG. 3 is a graph showing a 30 MHz 1 V RMS PN sequence on a Mil-Std 1553 data signal in accordance with an embodiment of the present invention.

In FIG. 2, a sinusoidal clock signal and its phase delayed copy is generated. The clock signal is used to drive a PN sequence generator. The PN sequence generator generates PN codes. PN codes are transmitted into the cable via capacitive coupling. This capacitive coupling isolates the test system from the (low frequency) power and (high frequency) data signals on live wires. The transmitted PN code is smaller than the −17.5 dB noise margin of the Mil-Std 1553 data and power signals so as not to affect the present data or power signal on wire. An example of the PN code on Mil-Std 1553 data cable is shown in FIG. 3. The phase delayed clock is used to drive another PN generator. This generator generated phase shifted copies of PN sequence for cross-correlation.

The reflected PN sequence is mixed with the phase shifted copies of the transmitted PN sequence by a mixer and integrated by a low pass filter. The output of the integration is digitized by an analog to digital converter. The output of the cross-correlation gives a peak whose location is proportional to the distance to the discontinuity on wire. A peak detector can be used to identify a peak in the output signifying a discontinuity on the wire. The output can then be digitized by an A/D converter and stored for future records.

Figure 4:
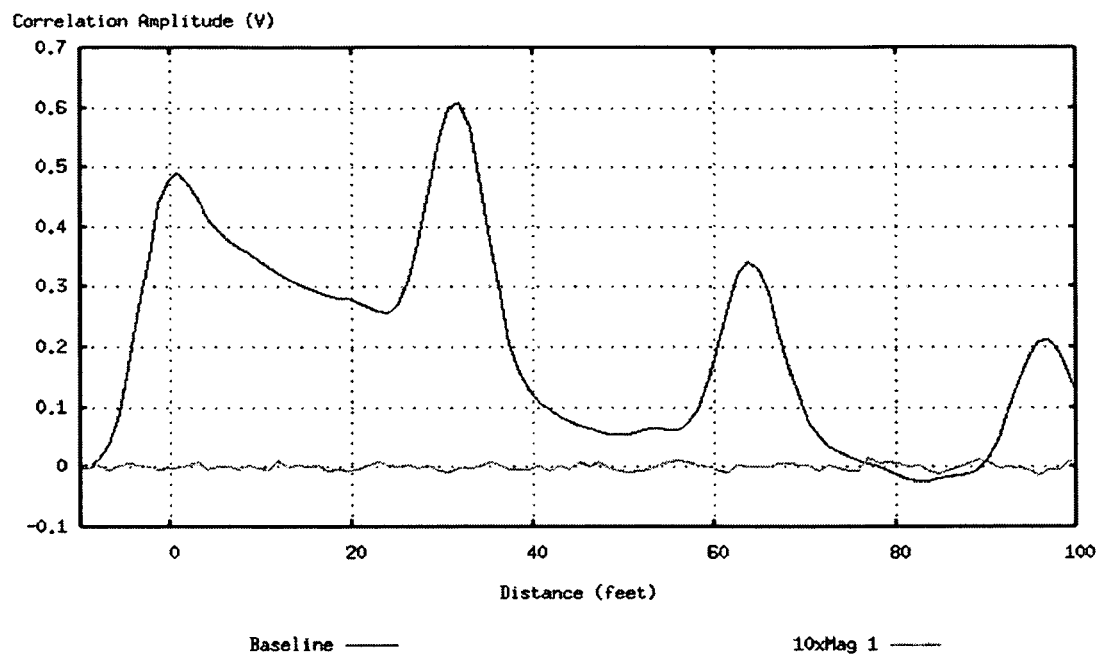
FIG. 4 is a graph showing Cross-correlation output of a test of a 31 foot RG-58 Coaxial cable with an open circuit at end in accordance with an embodiment of the present invention.

The advantage of using a PN sequence for cross correlation is the cross-correlation output of two copies of any PN sequence is very nearly zero except when they are exactly aligned. So to extract delay of discontinuity STDR cross-correlates shifted copies of the PN sequence with the reflected sequence. When the phase delay in received sequence is equalized by the variable phase delay, cross correlation achieves a peak. The cross-correlation is zero for all other times. The STDR test output of 31 feet RG-58 coaxial cable with open circuit at the end is shown in FIG. 4.

STDR can be used for fault location on live wires. STDR has the potential to locate faults on branched wiring networks, as it provides separate peaks for different discontinuities and junctions. STDR can be used to locate faults on live wires and can be potentially used for branched wiring networks after the development of suitable algorithm.

Spread Spectrum Time Domain Reflectometry (SSTDR)

Figure 5:
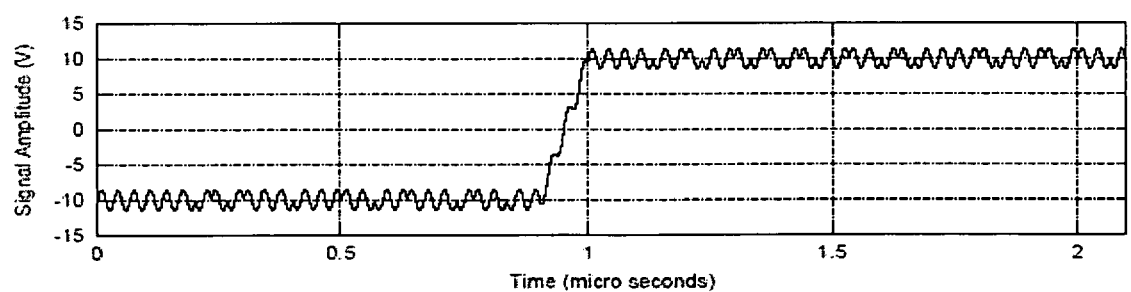
FIG. 5 is a graph indicating an SSTDR signal on a Mil-std 1553 data signal in accordance with an embodiment of the present invention.

Spread Spectrum Time Domain Reflectometry (SSTDR) uses a PN code modulated by a carrier sine wave to generate a binary phase shift keying (BPSK) signal to be transmitted on the wire. The sample SSTDR BPSK signal on a Mil-Std 1553 data signal is shown in FIG. 5.

Figure 6:
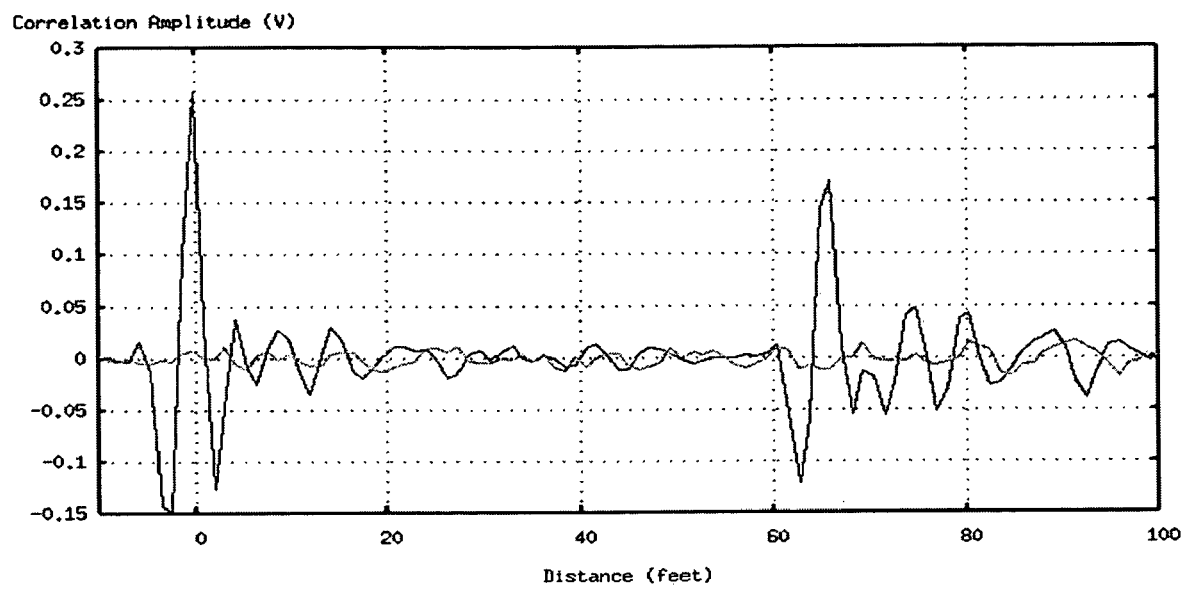
FIG. 6 is a graph indicating a cross-correlation output of a test of a 63 foot RG-58 cable with open circuit at end in accordance with an embodiment of the present invention.

The reflected BPSK signals are cross-correlated with the shifted copies of their transmitted counterparts. A peak is achieved when two copies of the signals align exactly. So, when the delay in reflected signal equalizes the phase delay in transmitted copy a peak appears which provides information about the discontinuity on wire. FIG. 6 shows the SSTDR cross correlation output in a test of a 63 foot long RG-58 coaxial cable with an open circuit at the end.

Like STDR, SSTDR can be used to locate faults on live wires and can be potentially used for branched wiring networks after the development of a suitable algorithm. SSTDR is more noise immune than STDR, but attenuates more than STDR on the line. Thus, it is better for testing high frequency data lines in flight, but an SSTDR system cannot analyze wires as long as an STDR system can.

STDR/SSTDR systems can be used to locate faults such as open circuits, short circuits and intermittent faults (arcs and frays) on wiring network. Accuracy of these systems can be increased with suitable hardware and frequency choice. A current circuit board implementation of these systems has demonstrated the feasibility of this system; however it is too large to be practical for onboard use.

STDR/SSTDR System Design

Sequence Time Domain Reflectometry (STDR) and Spread Spectrum Time Domain Reflectometry (SSTDR) are two methods that have been developed for the location of faults on live wires, potentially in flight. They inherit their principles of operation from wireless communication systems and RF radar systems. In STDR a pseudo noise (PN) sequence is generated and sent down the wire. The PN sequence gets reflected from a discontinuity on the wire. By cross correlating the reflected signal with the PN-sequence, the distance and type of discontinuity present on wire can be detected. In SSTDR a PN-sequence is modulated by a carrier sine wave to generate a Binary Phase Shift Keyed (BPSK) signal. The BPSK signal is then sent down the wire and is reflected by the discontinuity. The BPSK signal is found to give better signal-to-noise ratio at cross-correlation, particularly for substantially noisy environments. The following discussion describes the operation of the STDR/SSTDR system and the parameters that affect its performance and accuracy as well as the implementation of the system in a custom ASIC design.

STDR/SSTDR System

Figure 7:
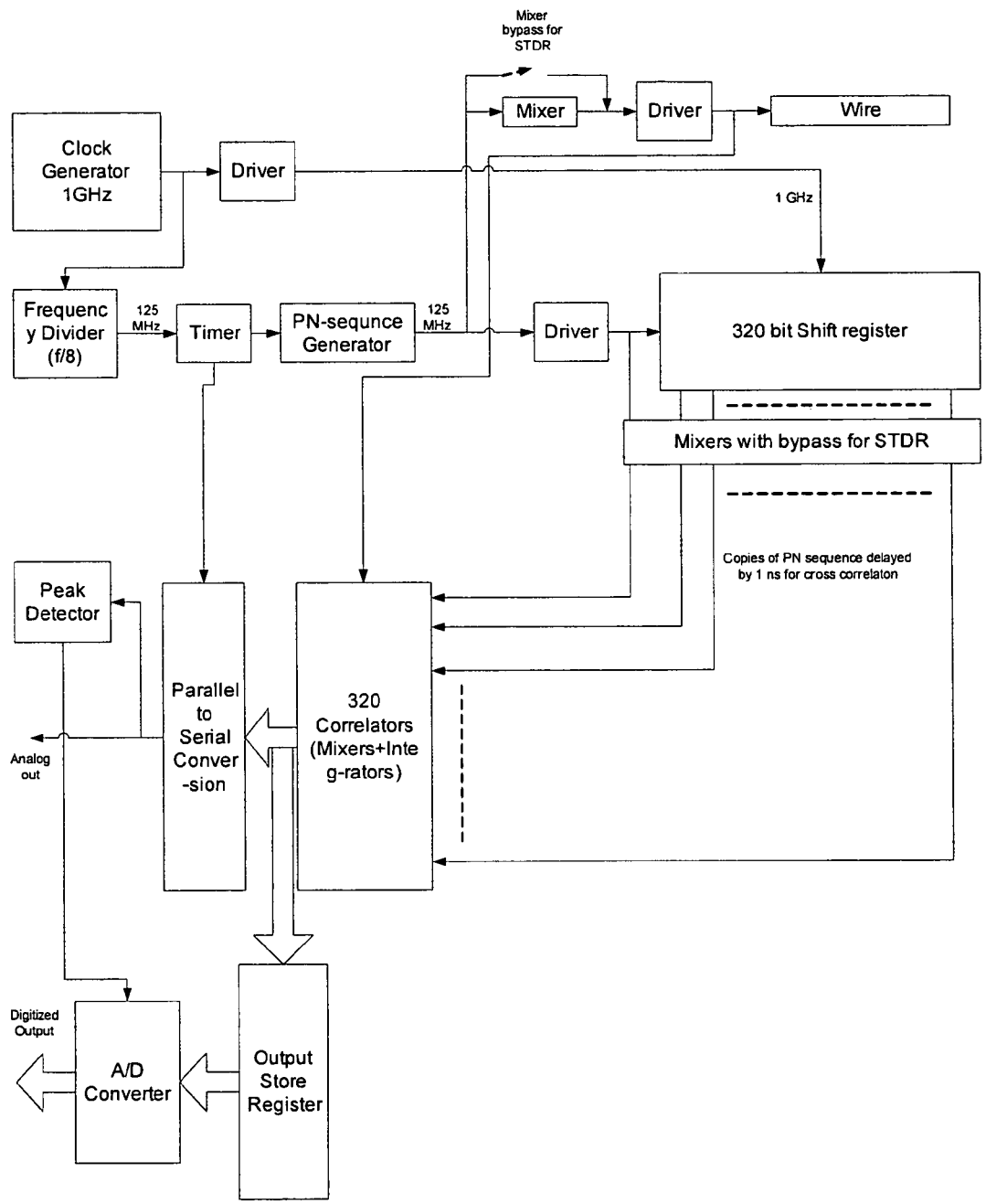
FIG. 7 is a block diagram of an STDR/SSTDR system in accordance with an embodiment of the present invention.

In the block diagram of the STDR/SSTDR system shown in FIG. 7 the correlation frequency (1 GHz) is generated by an on chip clock. The frequency can be divided by a predetermined number. In one embodiment, the frequency can be divided by 8 for producing a test PN-sequence frequency of 125 MHz. The timer circuit is used for synchronizing various component timings, and generating various control signals for parallel-to-serial conversion and loading the seed in the PN-sequence generator. The PN-sequence generator can generate the PN-sequence, which is either sent to the wire in the STDR mode or converted to BPSK by modulating the PN-sequence with a sine wave using a mixer for the SSTDR mode. Up-sampled and time delayed copies of the PN-sequence or BPSK signal can be produced by a shift register/mixer combination, which in turn can be correlated with the reflected signal using correlators. At the end of the correlation, parallel-to-serial conversion can be accomplished to produce analog output that is fed to a peak detector. If the peak detector identifies a peak in the output signifying a discontinuity on the wire, the output is digitized by an A/D converter and stored for future records.

FIG. 7 shows the high-speed detection mode of STDR/SSTDR. The same system can also be used in a power saving mode with a parallel-to-serial converter at the shift register instead of the output correlator, which will use only one correlator and mixer instead of the complete set. Thus by sacrificing the detection time, some power can be saved.

System Design Considerations

The STDR and SSTDR systems are complex systems. The aim of these systems is to find intermittent faults on live aircraft wires. To achieve this aim the following design considerations may be considered.

Frequency and Amplitude of Test Signal

The first important consideration in the design of STDR and SSTDR is to determine the frequency and amplitude of the PN sequence in the case of STDR or the BPSK modulated PN sequence in the case of the SSTDR system. The PN sequence and BPSK modulated PN sequence will hereinafter referred to as the "test signal". These systems are intended to be used on wire transmitting signals having a variety of frequencies and amplitudes. In one embodiment, a Mil-Std 1553 signal may be transmitted over the wire. In order for the 1553 signal and test signal to be transmitted concurrently with minimal interference the test signal is typically buried under the noise floor of the Mil-Std 1553 signal. Mil-Std 1553 is a 10 V p-p data signal of 1 MHz or 10 MHz. The specified noise floor for Mil-std 1553 signal is −17.5 dB. Thus, the test signal typically has an amplitude to enable it to be 17.5 dB below 10V (less than 1.3335 V p-p). For one embodiment of the system it was decided to use a test signal amplitude of 1 V p-p to provide some margin below the noise floor in order to not interfere with Mil-std 1553 signals.

The choice of the frequency of the test signal depends on the characteristics of wire. Since wire typically has greater attenuation at higher frequencies, it acts as a low pass filter. Wire typically only provides information up to a certain frequency. Typical cut-off frequencies of the wire are in the 400–600 MHz range, although this is highly dependent on the type of the wire. To obtain desired results, the test signal is designed to be below the cut-off frequency. The STDR signal is a square wave type digital signal with sharp rising and falling edges which consists of higher harmonics of fundamental frequencies. To minimize the affects of the higher harmonics on the 1553 signal, it is desired that the test signal frequency be well below the typical cutoff frequencies of cable. In one embodiment, the STDR and SSTDR systems are designed to use a test signal having a 125 MHz PN sequence.

Resolution

Another important design consideration is the resolution. Resolution is the precision with which a single fault location can be identified. The resolution can be determined according to the following equation:

$$L = 2\tau V_p \quad (3.1)$$

Where $V_p$=phase velocity of the wave on the wire ≅ 0.67* Speed of Light (c), and τ=Period of correlation=1 ns ((1

GHz)$^{-1}$) for the embodiment. This gives a resolution of about 16 inches on a typical aircraft wire without using any special techniques on the designed systems.

Sub-Chip Correlation

Sub-chip correlation is a highlight of these STDR and SSTDR systems that increases the accuracy and resolution of the systems by a large factor. In correlation the transmitted PN sequence is delayed by a chip for each sample, and then multiplied and integrated by the received reflected PN sequence from the wire to get one correlation point. This process is repeated up to the length of the PN sequence. Thus two correlation points are separated by the wavelength-λ of the test signal.

Figure 8:
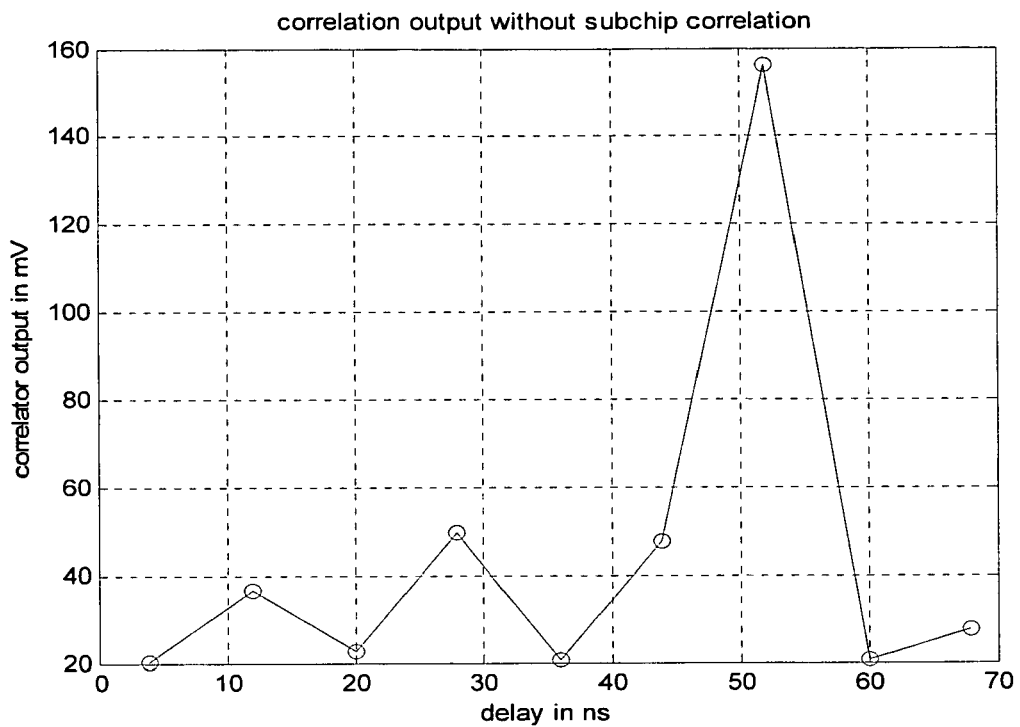
FIG. 8 is a graph of an STDR output showing an open circuit 50 ns from a testing end without using sub-chip correlation.

Now if the PN sequence is over-sampled by a factor of N and delayed by only one sub-sample of the chip, there will be N correlation points per chip. The two immediate correlation points will be λ/N apart. Thus sub-chip correlation improves accuracy and resolution of STDR and SSTDR systems by a factor of N. FIG. 8 shows the simulated STDR correlation for an open circuited delay-attenuation model of cable. The 50 ns delay is observed without using sub-chip correlation in FIG. 8 and with sub-chip correlation (N=8) in FIG. 9.

Figure 9:
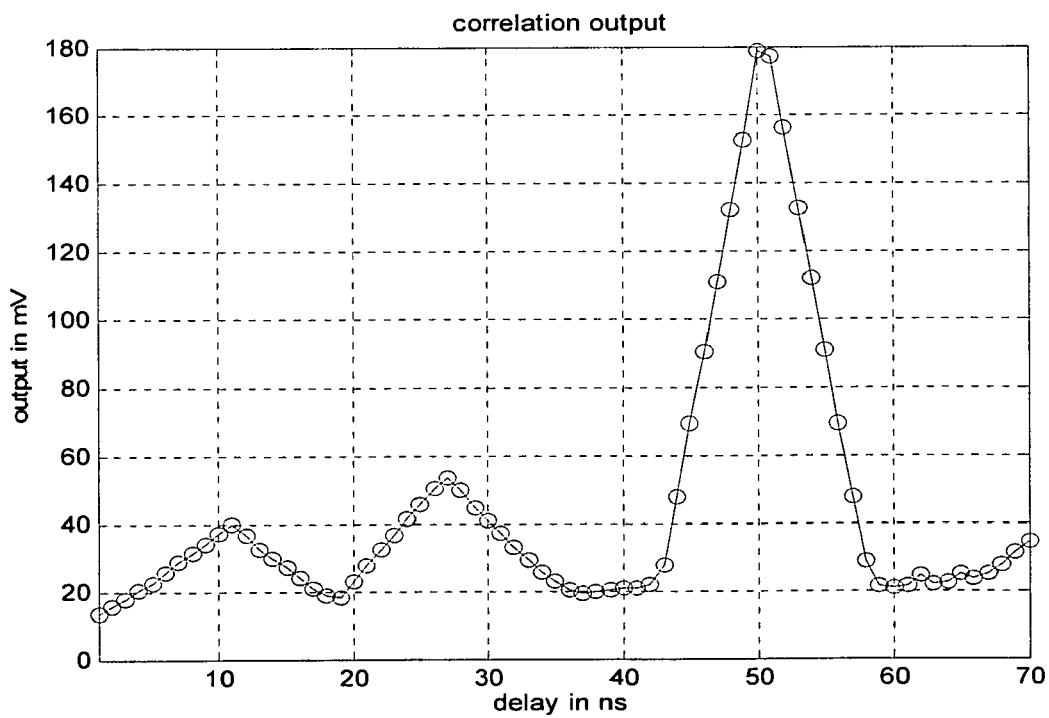
FIG. 9 is a graph of STDR output showing an open circuit at 50 ns from the testing end using sub-chip correlation in accordance with an embodiment of the present invention.

From FIGS. 8 and 9 the advantages of sub-chip correlation are obvious. The full chip correlation shown in FIG. 8 misses the actual peak by a couple of nano-seconds. Also the signal-to-noise ratio is much better using sub-chip correlation shown in FIG. 9.

Sampling Clock Frequency

The sampling clock frequency is determined by the amount of over-sampling of the PN sequence for sub-chip correlation. The choice of sampling frequency is dominated by the chip-area and power considerations. There is a clear trade-off between the accuracy, resolution vs. chip area, and power consumption. A higher sampling clock frequency increases accuracy and resolution but also consumes more chip area and uses more power. Considering those trade-offs for the proposed system a sampling frequency of 1 GHz was chosen in one embodiment to provide sufficient accuracy while not consuming too much chip area and power. That implies an up-sampling factor of N=8 for a 125 MHz PN sequence.

Delay Methods

Several delay methods exist to perform correlation between two PN sequences. One of the delay methods is to use an analog phase shifter to shift a cosine clock used to generate the reference PN sequence. Another method is to use a digital delay line of shift registers to delay the digitally shaped square clock. A third method is to delay the PN sequence by passing it through a delay line. The third method was implemented in one embodiment of a processor design. A tapped delay line can be implemented wherein a parallel output at each tap of every delay element is taken to generate parallel copies of the PN sequence shifted by different delays. This method can be used to generate parallel shifted copies of the PN sequence while simultaneously up-sampling it using a sub-chip sampler.

Figure 27:
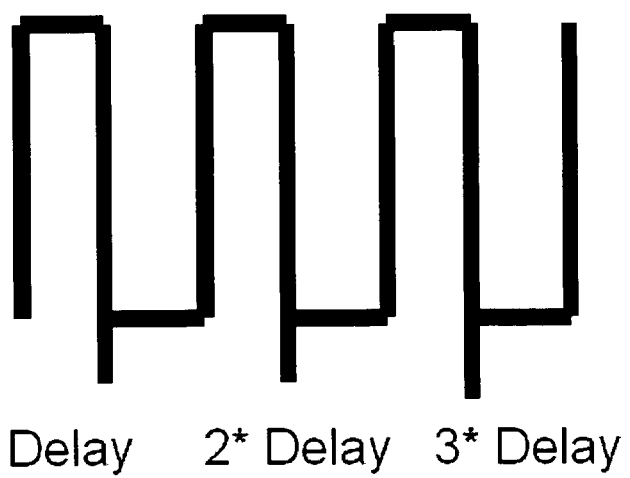
FIG. 27 is a diagram showing an implementation of a surface acoustic wave device in accordance with an embodiment of the present invention.

Subchip delay can also be implemented by placing a surface acoustic wave (SAW) tapped delay line in series with the signal to be delayed. Surface acoustic waves travel slower than electromagnetic waves, so the delay from a specific length of line is longer than the delay from the same length of electrical line (such as the one being measured). The speed with which the signal traverses the SAW device can be controlled by the manufacture of the SAW structure. Taking multiple taps off the delay line will give incrementally shifted copies of the input signal. One form of SAW structure is shown in FIG. 27, wherein a structure having a delay of three cycles is shown. The lines can be constructed so that the delay shown in FIG. 27 is a portion of the chip clock (a "sub-chip").

System Timing

An important timing consideration is the need to detect intermittent faults of short duration. Intermittent faults can occur on wires for as little as 2–5 milliseconds. In that time a sensor has to locate and identify them. This timing constraint presses for the use of high frequency to sample enough points during that intermittent fault in order to locate it. One embodiment of the STDR/SSTDR system uses a parallel architecture at high frequency. That allows the system to finish a scan in a few microseconds depending on the length of the PN sequence used. For example, a scan of wire using a PN sequence having a length of 127 bits can be done in 1.016 μs, which is well within the latency period desired.

Design Strategy

A novel ASIC chip was designed to accommodate the above mentioned design criteria. The novel design incorporated several components operating at 1 GHz while maintaining the integrity of the signal. Oversampling the PN sequence enabled many portions of the system, such as the PN-generator and drivers, to be designed to run at a more feasible 125 MHz. After building the digital portion of the transmitter subsection, the receiver analog subsection (mixer and integrator) was designed. A parallel-to-serial converter to read the final correlation value and a peak detector were also designed in the receiver subsection. The system was designed and simulated using building blocks of functional components. The ASIC chip was configured to operate using a SiGe BiCMOS design. The SiGe material has a high cutoff frequency (10 GHz) and has low noise compared to a CMOS design. Thus, SiGe is an optimal material from which to form the novel ASIC chip.

Subsystem Design: Transmitter Subsection

This section presents the design of components of the transmitter subsection of the STDR/SSTDR systems and their simulation results. The components that are common in the transmitter sub-section of both the STDR and SSTDR systems are presented in this section. The role of the transmitter subsection, as designed in this embodiment, is to generate the PN-sequence at 125 MHz and to sample it at 1 GHz for sub-chip correlation. The section also generates the system clock at 1 GHz, a PN-generator clock at 125 MHz and maintains timing in the correlation process.

Design of Digital Building Blocks

Figure 10A:
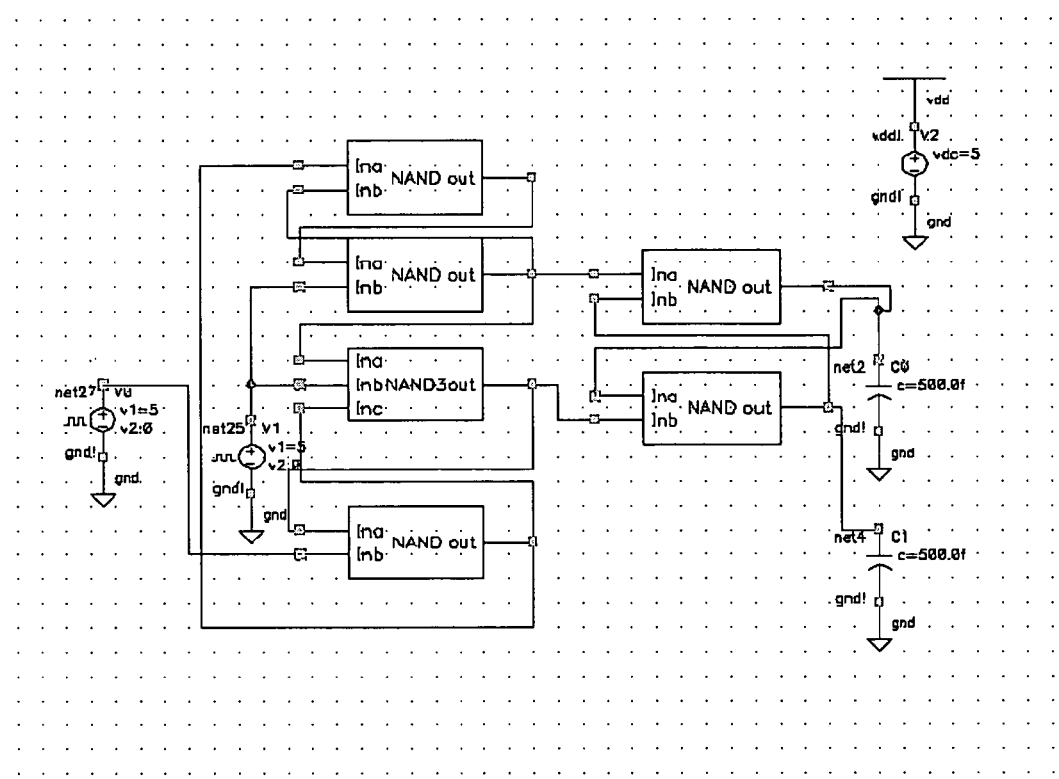
FIG. 10a is a diagram of a positive edge triggered D-FF in accordance with an embodiment of the present invention.
Figure 10B:
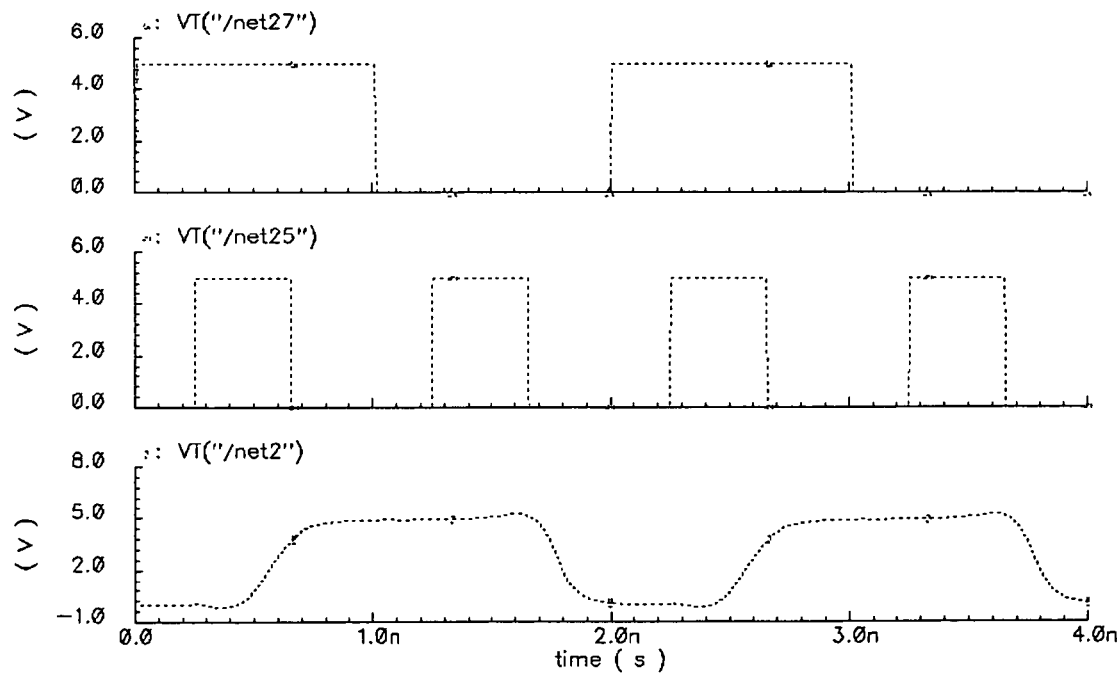
FIG. 10b is a graph of a response of positive edge triggered D-FF at 1 GHz in accordance with an embodiment of the present invention.

A positive edge triggered D type flip flop was determined to be a substantially reliable and stable flip-flop design. The positive edge trigger enables the d flip-flop to reevaluate its output at the positive edge of the clock. This enables the flip-flop to be quite stable in a feedback loop and does not generate timing jitter if clock edges provided to the flip-flop are jitter free relative to each other. FIG. 10a shows a design of the positive edge triggered D flip-flop, with simulation results shown in FIG. 10b. The simulation results show that the flip-flop operates as designed at 1 GHz frequency with minimal timing jitter and with rise and fall times on the order of 150 ps. The positive and negative pulse widths are also almost equal. Thus, the positive edge triggered D flip-flop is quite suitable for use in the PN-generator and sub-chip sampler portions of the STDR/SSTDR systems.

Using SiGe in place of CMOS provides about 20–40 times smaller size and power consumption on digital blocks of the chip. The smaller size and power limitations provide a huge advantage over a comparable CMOS chip.

PN Sequence Generator

The PN-sequence generator is a key component in STDR/SSTDR sensors. The PN-sequence generator creates a pseudo noise sequence that is sent down the wire as the test signal. The properties of this PN-sequence determine the size of the faults that the sensor can locate and with what precision. One important property of the PN-sequence is that the cross correlation of the PN-sequence is nearly zero with time-delayed copies of itself and with other PN-sequences while the auto correlation of the PN sequence is nearly one. There are various types of PN-codes and PN code generators. Maximal length (ML) codes were previously found to give the best correlation output for this type of application. The ML code generator is a shift register of D flip-flops where two of the outputs of the flip-flops are X-OR'd and fed back to the first D flip-flop. If the number of flip-flops is n, than the PN code is $2^n-1$ chips long. The PN-sequence generator can be made programmable to enable a plurality of types of PN sequences to be produced. A seed feeding logic can be added to the basic architecture for the PN sequence generator. The seed feeding logic feeds the initial states to the PN sequence generator at its start. Seed feeding logic assures that every time the PN sequence generator is started or reset it will generate the same PN sequence from the same initial state. The seed is also important to generate a full $2^n-1$ length PN code. If the seed is uncorrelated with itself, the PN sequence generator creates a full length code. Otherwise, the code length is reduced. Thus, seed feeding ensures that the circuit will generate the same $2^n-1$ length PN code each time a code is generated. This will enable each reflected PN code sequence to be correlated with each transmitted PN code sequence.

Figure 11A:
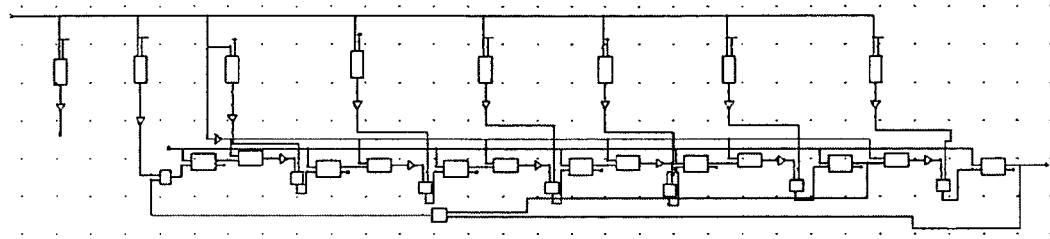
FIG. 11a is a diagram of a PN-sequence generator using positive edge triggered D-FF in accordance with an embodiment of the present invention.
Figure 11B:
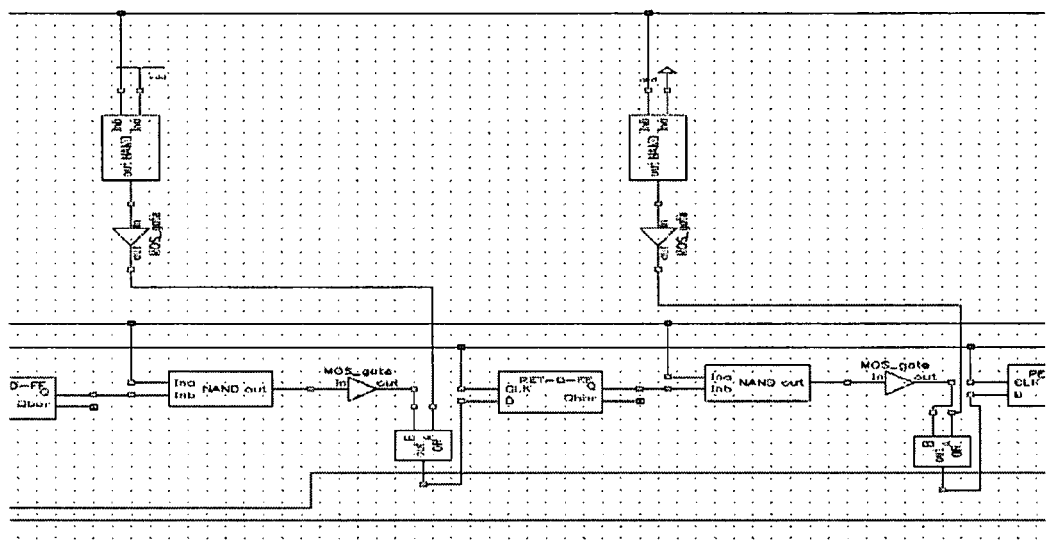
FIG. 11b is a close up view of a PN-sequence generator with seed feeding logic in accordance with an embodiment of the present invention.
Figure 11C:
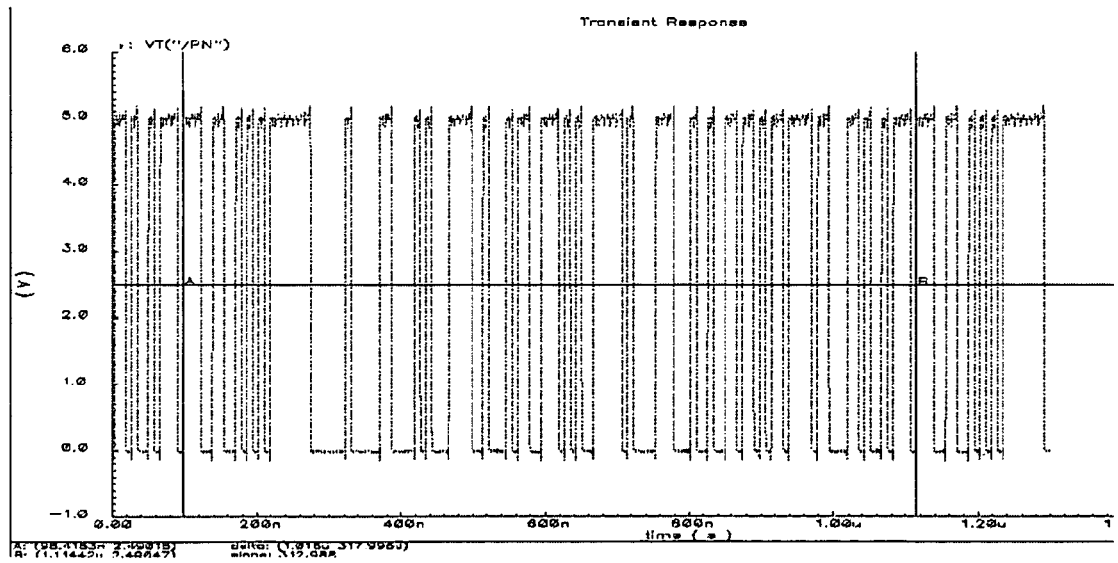
FIG. 11c is a graph showing a 127-chip PN-sequence output at 125 MHz which repeats after 1.016 µs in accordance with an embodiment of the present invention.

Design of the PN sequence generator with seven states and seed feeding logic is shown in FIG. 11*a*. This PN sequence generator generates a $2^7-1=127$ chip long PN code sequence. One stage of the generator is shown in FIG. 11*b* with seed feeding logic. The PN sequence generator was simulated at 125 MHz, and results are plotted in FIG. 11*c*. The generator creates a full 127-chip PN sequence as shown by the two markers, and the length of the complete sequence is 127(8 ns)=1.016 μs.

System Timer

An 8-bit ripple counter with reset was used as the system timer. A master-slave JK flip-flop was designed for this purpose. When J=1 and K=1 the flip-flop toggles its state on the positive edge of the clock. In one embodiment, the counter is comprised of a set of 8 flip-flops with their J and K inputs tied to 1. An output of one flip-flop is used to clock the input of the next flip-flop. The first flip-flop can be clocked by the system clock and can produce a binary ripple counter.

To create a timer from this counter, a reset can be added. At reset, all flip-flops are tied with J=0 and K=1 and clocked by the system clock instead of the previous flip-flop output to clear their state. The timer can be used to keep the timing of the system and generate control signals when required with suitable combinational logic.

Figure 12A:
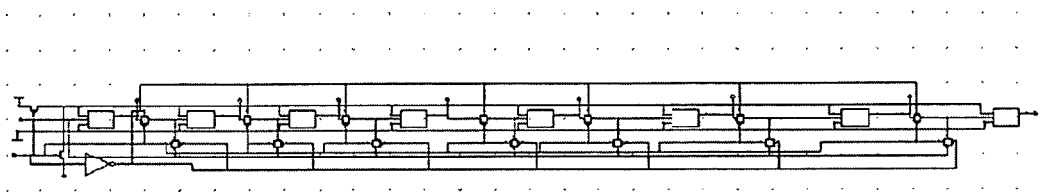
FIG. 12a is a diagram of an 8-bit ripple counter with a reset as a system timer in accordance with an embodiment of the present invention.
Figure 12B:
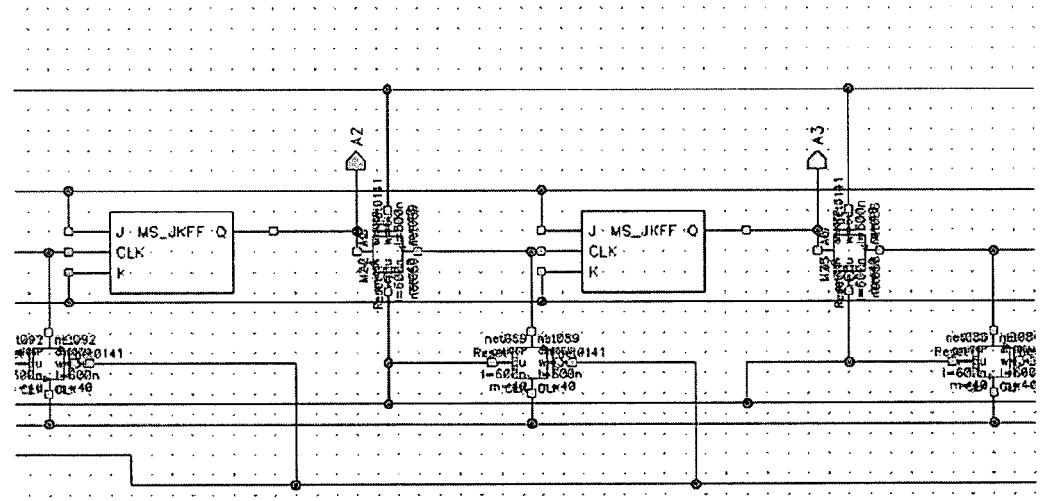
FIG. 12b is a diagram of one bit of the 8-bit ripple counter with a reset as a system timer in accordance with an embodiment of the present invention.
Figure 12C:
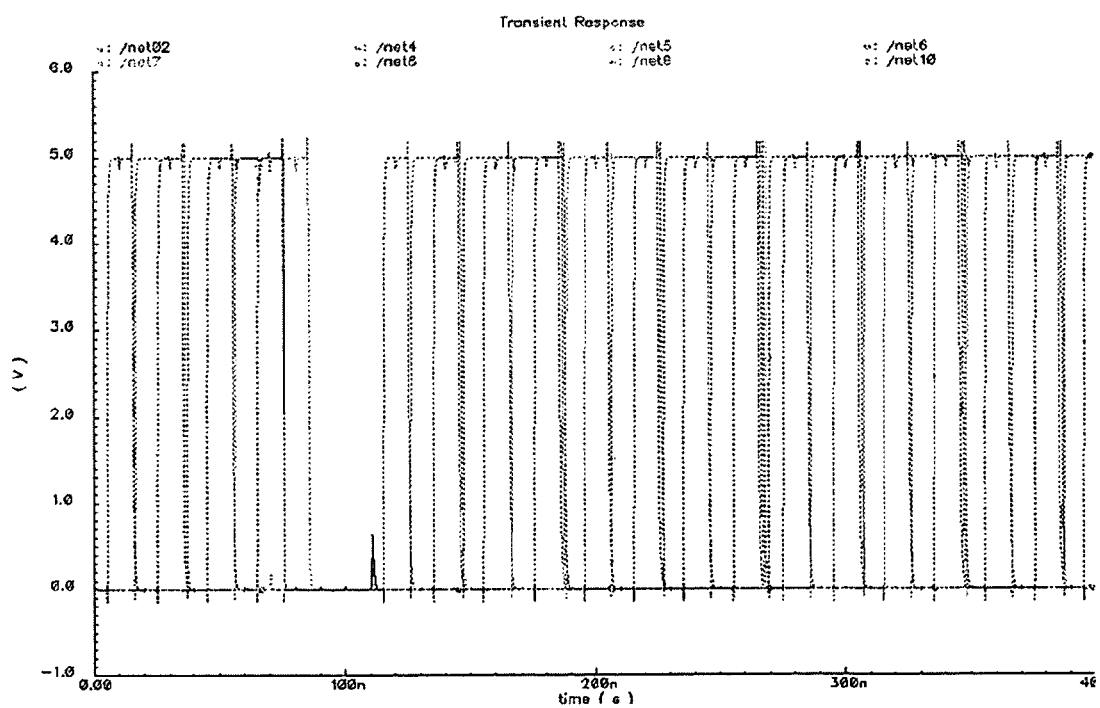
FIG. 12c is a graph showing results of a ripple counter with reset in accordance with an embodiment of the present invention.

The design of the 8-bit ripple counter with reset as a system timer is shown in FIG. 12*a*. One bit of the timer is shown in FIG. 12*b*. The simulation results of the counter are shown in FIG. 12*c*. The simulation results show that the timer counts as expected, and the reset also works well. The maximum number the timer can count to is $2^8=256$. With an operating frequency of 125 MHz the timer can time and generate control signals for operations up to 2048 ns.

Frequency Divider

The STDR/SSTDR system requires two different clocks. The first clock (125 MHz) is for generating the PN sequence, and the second (1 GHz) is for sampling the PN sequence. The 1 GHz clock is generated using an on chip clock generator. The 125 MHz clock is generated by dividing the 1 GHz clock by 8 using a frequency divider.

Figure 13:
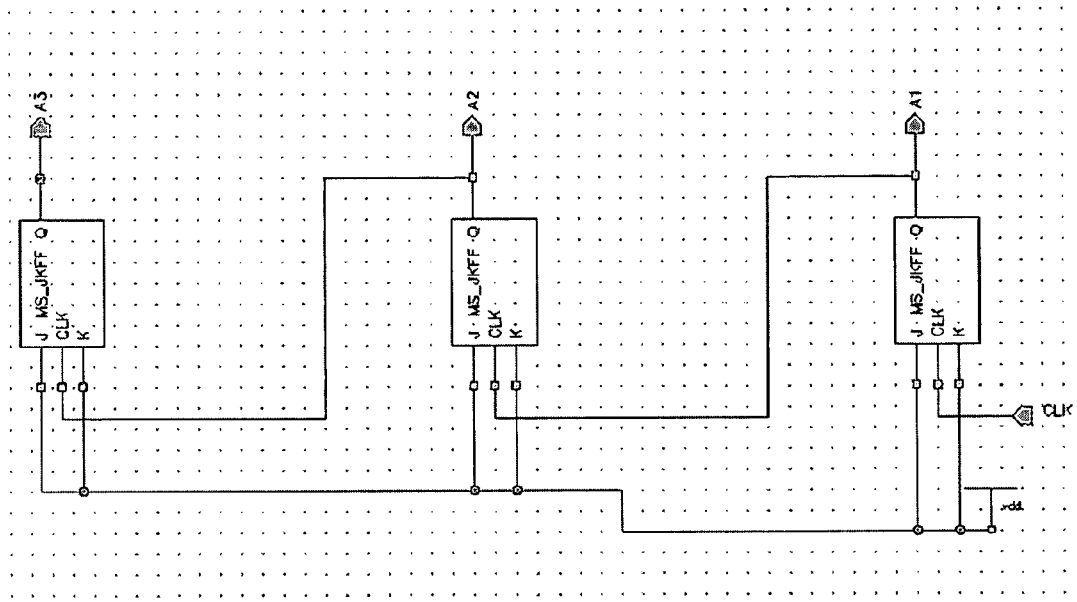
FIG. 13 is a diagram of a 3-bit binary counter as a frequency divider in accordance with an embodiment of the present invention.
Figure 14:
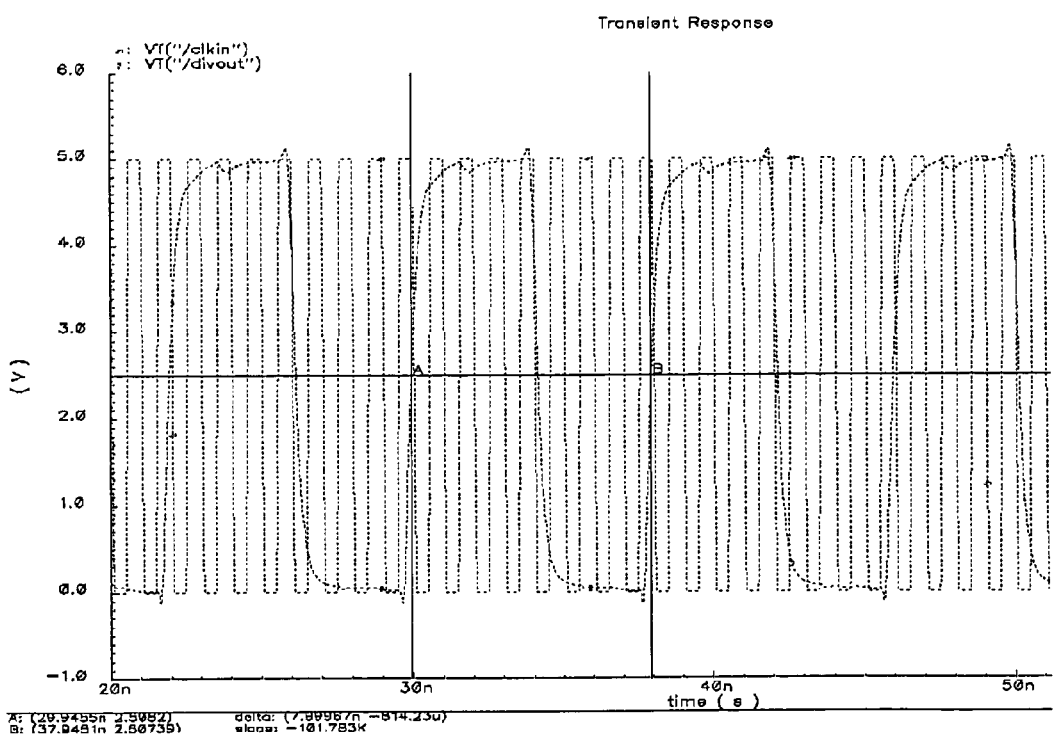
FIG. 14 is a graph showing simulation results of the frequency divider showing a 1 GHz clock being divided by 8 in accordance with an embodiment of the present invention.

In one embodiment, the frequency divider can be configured as a binary counter using master slave JK flip-flops. The third bit of this counter produces a signal having a frequency which is ⅛th the frequency of the clock. FIG. 13 shows the design of the frequency divider with simulation results presented in FIG. 14. The simulation shows the 125 MHz clock generated by dividing the 1 GHz system clock.

Sub-Chip Sampler

The sub-chip sampler is also a key component for the resolution and accuracy of the STDR/SSTDR systems. Ideally we would like to get as much resolution as possible, so we would like to have the number of correlation points as large as possible. This can be achieved by upsampling the PN sequence to get sub-chip points for correlation. The sub-chip sampling frequency decides how close the two samples of the PN sequence will be correlated. Finer sampling allows the sensor to obtain more information from the wire and in turn increases the resolution of the sensor.

Figure 15A:
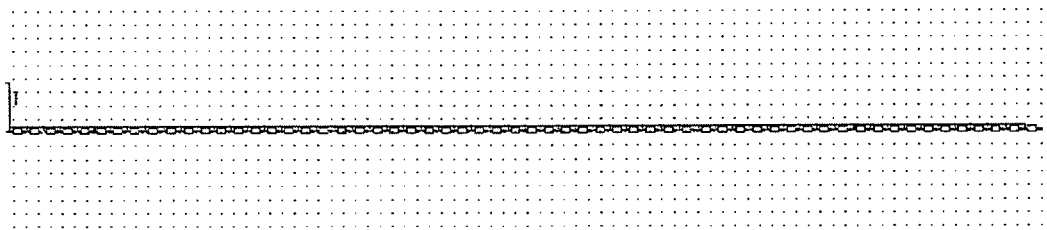
FIG. 15a is a diagram of a design of the sub-chip sampler in accordance with an embodiment of the present invention.
Figure 15B:
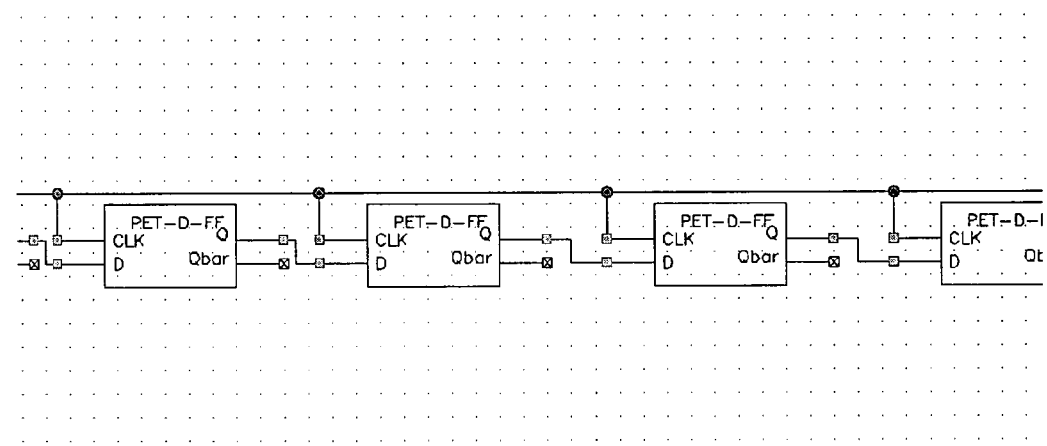
FIG. 15b is a close up view of sub-chip sampler architecture in accordance with an embodiment of the present invention.
Figure 15C:
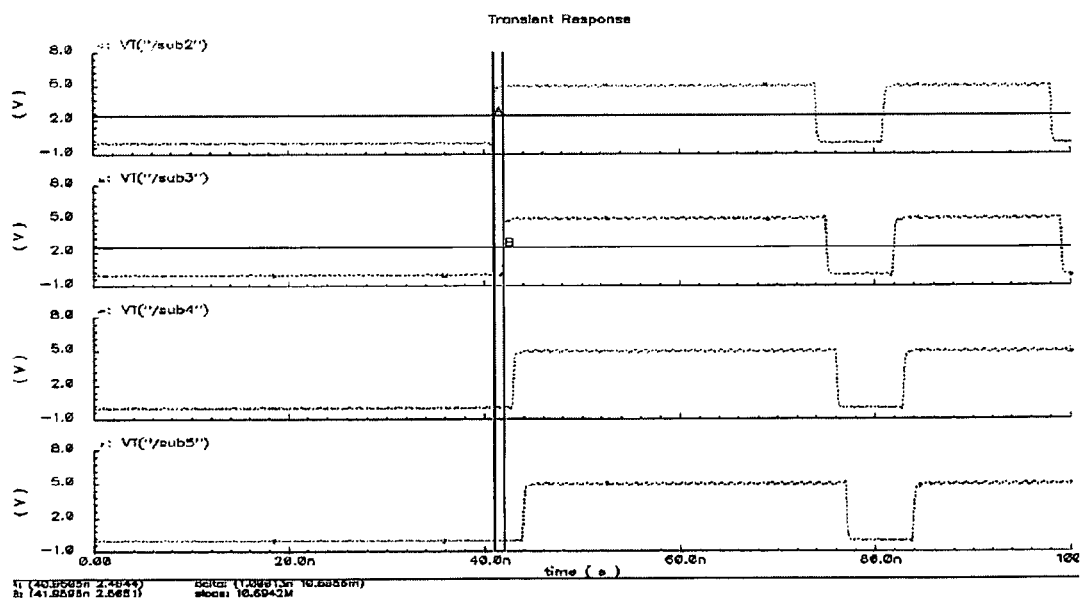
FIG. 15c is a graph of sub-chip sampling, showing copies of a PN sequence shifted by 1 ns relative to previous stage in accordance with an embodiment of the present invention.

The sub-chip sampler can be characterized as a phase shifting circuit which shifts the phase of the input signal by a tiny amount (one sub-chip) each time the signal passes through the phase shifter. For STDR/SSTDR implementation in an analog system, phase shifters were used to shift the clock that produced the PN sequence. For digital, on-chip implementation of the sub-chip sampler a long shift register of n positive edge triggered D flip-flops clocking at a multiple of the PN sequence frequency can be used. In one embodiment, a design of the sub-chip sampler is shown in FIG. 15*a*, with a close up view shown in FIG. 15*b*. FIG. 15*c* shows the simulation results of the sub-chip sampler sampling the PN sequence at the $2^{nd}$, $3^{rd}$, $4^{th}$ and $5^{th}$ stage using a 1 GHz sampling frequency. The copies of the PN sequence shifted by 1 ns at each stage are observed, as expected. These shifted copies of the PN sequence are now available for correlation (the shift-multiply-add operation).

The length of the sub-chip sampler determines the resolution and length of the wire that can be tested using the sensor. Using equation 3.1, the resolution that can be achieved using the sub-chip sampler of this embodiment is 16 inches. It can be assumed that most wires and cables in an aircraft have a maximum length of approximately 400 feet. Since every sub-chip provides resolution of 16 inches, the total number of sub-chips that must be scanned is (400 ft)(12 in/ft)/(16 in)=300. Thus, to scan an entire 400 foot long wire, 300 sub-chips are scanned. Therefore, in one embodiment, the sub-chip sampler can be designed to have 300 sections, with each section designed to test approximately 16 inches. Of course, the sub-chip sampler can be configured to test for and locate discontinuities or arcs in any length of wire, depending upon the desired size of the processor and resolution of each sub-chip.

System Clock

Since STDR/SSTDR sensors are high speed circuits requiring accurate timing and sampling, the system clock design and distribution can be one of the most critical circuit design factors for achieving accuracy and resolution. Clocks are usually provided by oscillators. There are numerous approaches for designing the voltage controlled (VCO) or other type of oscillator. Several methods were considered for generating the clock for STDR/SSTDR including using a tunable LC oscillator, VCO, or a ring oscillator.

First the LC oscillator for generating the clock at 1 GHz was designed. The frequency of the oscillator is determined by $$f = \frac{1}{2*\pi*\sqrt{LC}} \quad (3.4)$$

Figure 16A:
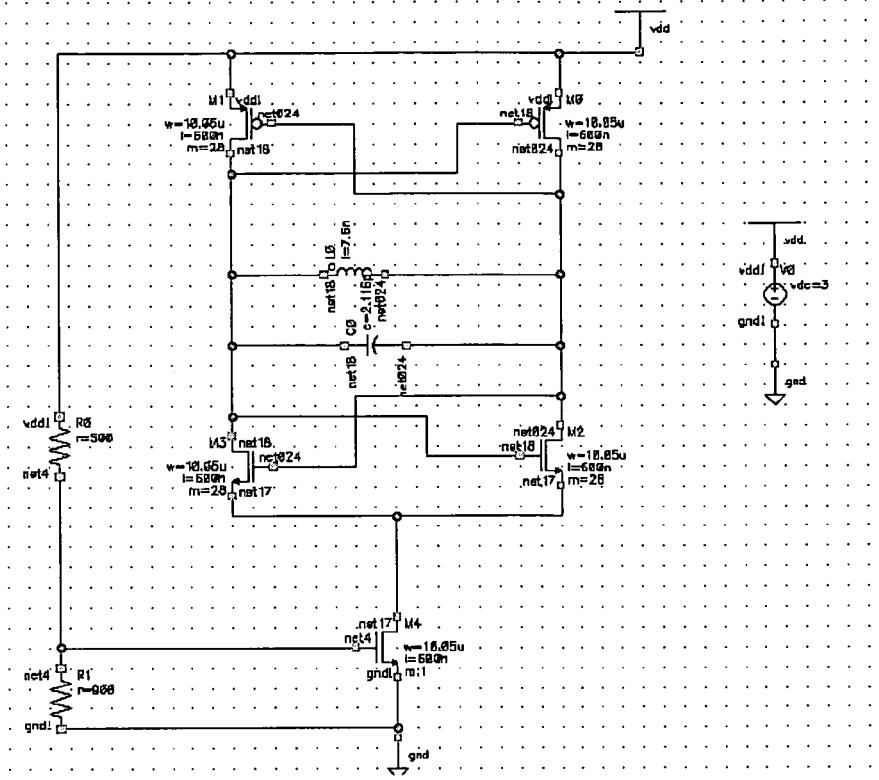
FIG. 16a is a diagram of a clock using a tunable LC oscillator in accordance with an embodiment of the present invention.
Figure 16B:
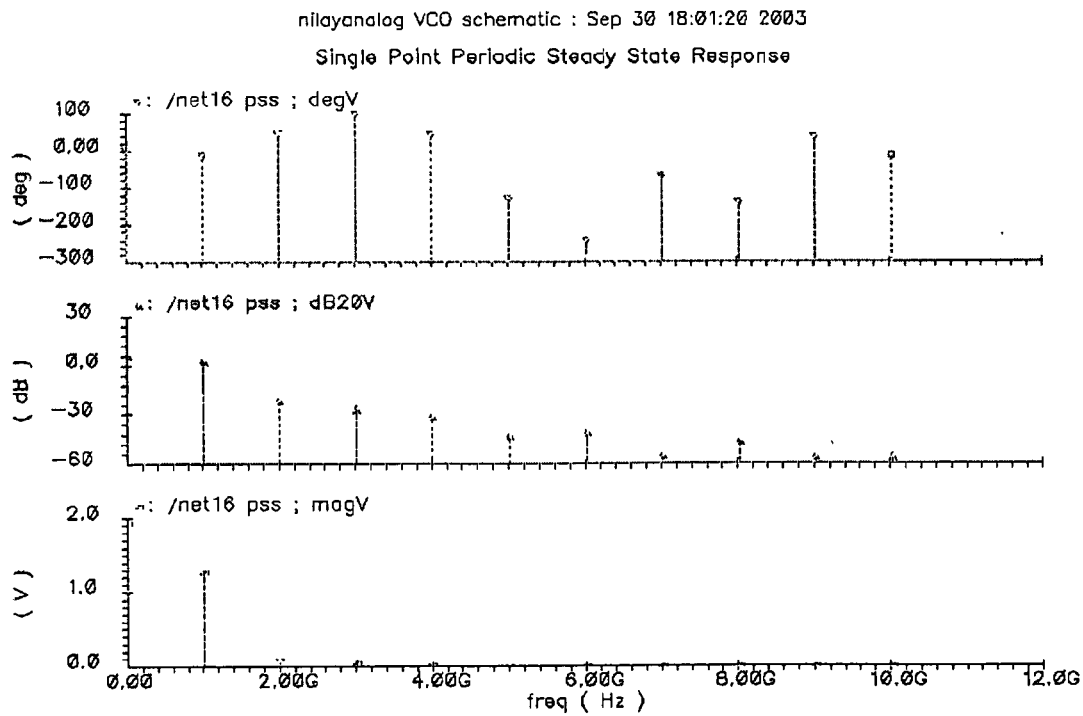
FIG. 16b is a graph showing an amplitude and phase response of the LC oscillator vs. frequency oscillating at 1 GHz in accordance with an embodiment of the present invention.

The LC tank circuit is designed using equation 3.4 to oscillate at 1 GHz. Using the tank circuit a differential CMOS LC oscillator was designed. One possible design using a clock and a tunable LC oscillator is shown in FIG. 16a. The circuit was simulated, and simulation results are plotted in FIG. 16b showing the frequency and spectrum of the generated clock. Simulation results show that the oscillator generates a 1 GHz fundamental frequency as the system clock. A second harmonic is generated −23 dB below the fundamental frequency.

This clock can be built on chip by leaving the inductor outside the chip for tuning. This circuit can be converted to a VCO by simply replacing the capacitor in the tank circuit by a varactor diode or a MOS capacitor.

Figure 17:
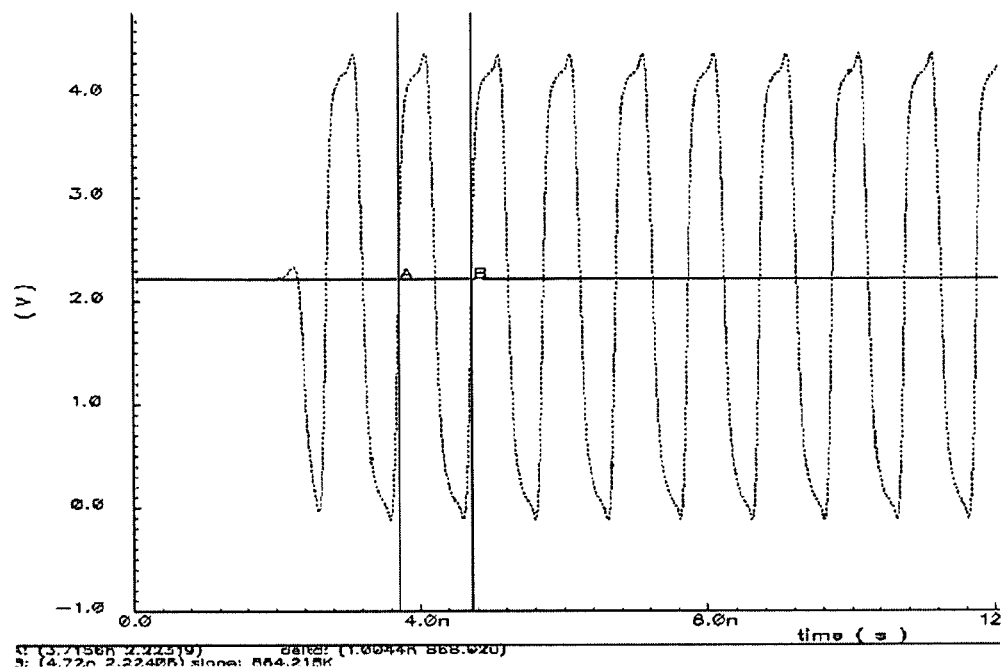
FIG. 17 is a graph showing a clock generation using ring oscillator in accordance with an embodiment of the present invention.

Another approach to build the clock is to use a ring oscillator. The oscillation frequency of the oscillator can be varied by varying the supply voltage of the inverters in the oscillator using a potentiometer. FIG. 17 shows the clock generated by the ring oscillator at 1 GHz using a 4.5 V supply voltage.

Both the LC and ring oscillators work as expected, but the decision of which clock to use in the sensor depends on the simulation results of how both of the clocks drive the entire system and their stability against loading, supply noise and their immunity to variation in operating conditions. The LC oscillator generates a low magnitude clock of 1.3 V. Special drivers are required to get the full rail-to-rail swing from that clock with low noise margin, as the switching point of the drivers is too low. The ring oscillator frequency is susceptible to supply voltage noise.

Analysis of Transmitter Sub-Section

Figure 18:
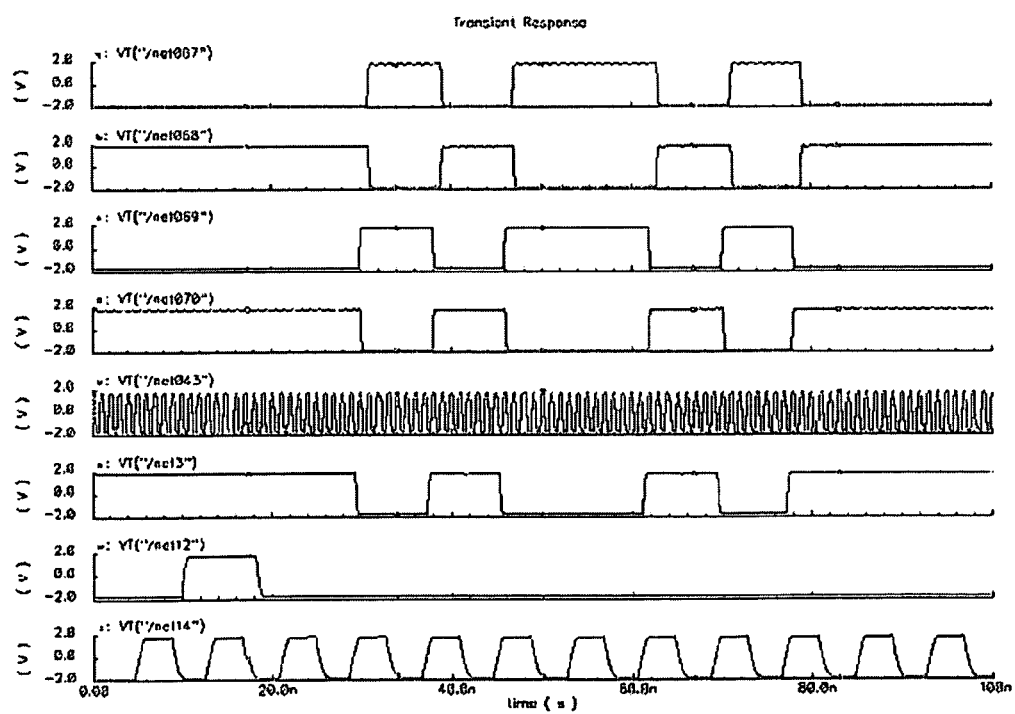
FIG. 18 is a graph showing a transmitter sub-section simulation testing in accordance with an embodiment of the present invention.

The transmitter for the STDR/SSTDR system design has been analyzed. The timing and frequency constraints on the system as well as various sub-blocks have been determined. The various component designs of the transmitter sub-section were done keeping the timing and frequency requirements in mind. The blocks were simulated and all the components performed well in simulations. The timing and frequencies were extremely close to desired values. The simulation results for the sub-chip sampler were taken by connecting all components and simulating the transmitter sub-section. All the components performed well and showed very good synchronization during the simulation. The simulation of the test of the digital subsystem is shown on FIG. 18. The simulation shows a 1 GHz clock, generation of 125 MHz clock, generation of start pulse by decoding, PN sequence generation and generation of the shifted parallel copies of the PN sequence as differential signals. The transmitter subsection was determined to function as desired.

Subsystem Design: Receiver Subsection

Having designed and simulated the transmitter sub-section of STDR/SSTDR systems, we will now briefly discuss the receiver sub-section. While the transmitter sub-section is important for resolution and accuracy; the receiver sub-section determines the SNR of the system. A very important consideration in the design of this sub-section is proper multiplication and frequency translation of the received signal by the mixer. Also maintaining low noise, high gain and signal integrity at every component is essential for proper operation of the system.

This section presents design considerations of the important components of the receiver sub-section including the amplifiers, mixer and integrator. The design of STDR/SSTDR system is then implemented by combining designs of transmitter and receiver sub-sections. STDR and SSTDR systems are simulated, and the results are disclosed.

The receiver subsection can receive reflected signals from the transmission line. In one embodiment, the signals are received through a coupling capacitor. The capacitive coupling can be used to filter out low frequency Mil-1553 signals and realign the reflected PN sequence or BPSK signal at the zero DC level. The test signal can pass through the amplifier and get converted into a differential signal appropriate for a mixer RF input. Correlation can then be performed. By placing the system onto a microprocessor, a plurality of correlation sections can be performed simultaneously, depending upon the area allotted for the correlation section on the chip. In one embodiment, the correlation section can comprise 80 parallel correlators for parallel correlation. Each correlator can be formed using a mixer, an op-amp, and an integrator trio. The same RF input can be fed to all mixers from the output of the differential amplifier. The transmitter sub-section provides shifted parallel copies of the PN sequence in the case of the STDR system and of the BPSK signal in the case of the SSTDR system. The mixer multiplies the received reflected signal with a shifted copy of the PN sequence, and the differential output of the mixer is again converted to a single ended output with the help of an op-amp. The output of the op-amp is then fed to an integrator. The outputs of various integrators after correlation of the entire PN sequence enable detection and location of a correlation peak, if one exists.

Mixer Subsection

The mixer is one of the most important parts of the receiver subsection. The output of the mixer enables the determination of when the two PN sequences match. The mixer multiplies two signals as shown in equation 4.1. When two sinusoids V1*sin($\omega_1$t) and V2*sin($\omega_2$t) are multiplied using mixer the output is given by $$IF = K*V1*V2*\{\cos[(\omega_2-\omega_1)t] - \cos[(\omega_2+\omega_1)t]\} \quad (4.1)$$

Figure 19A:
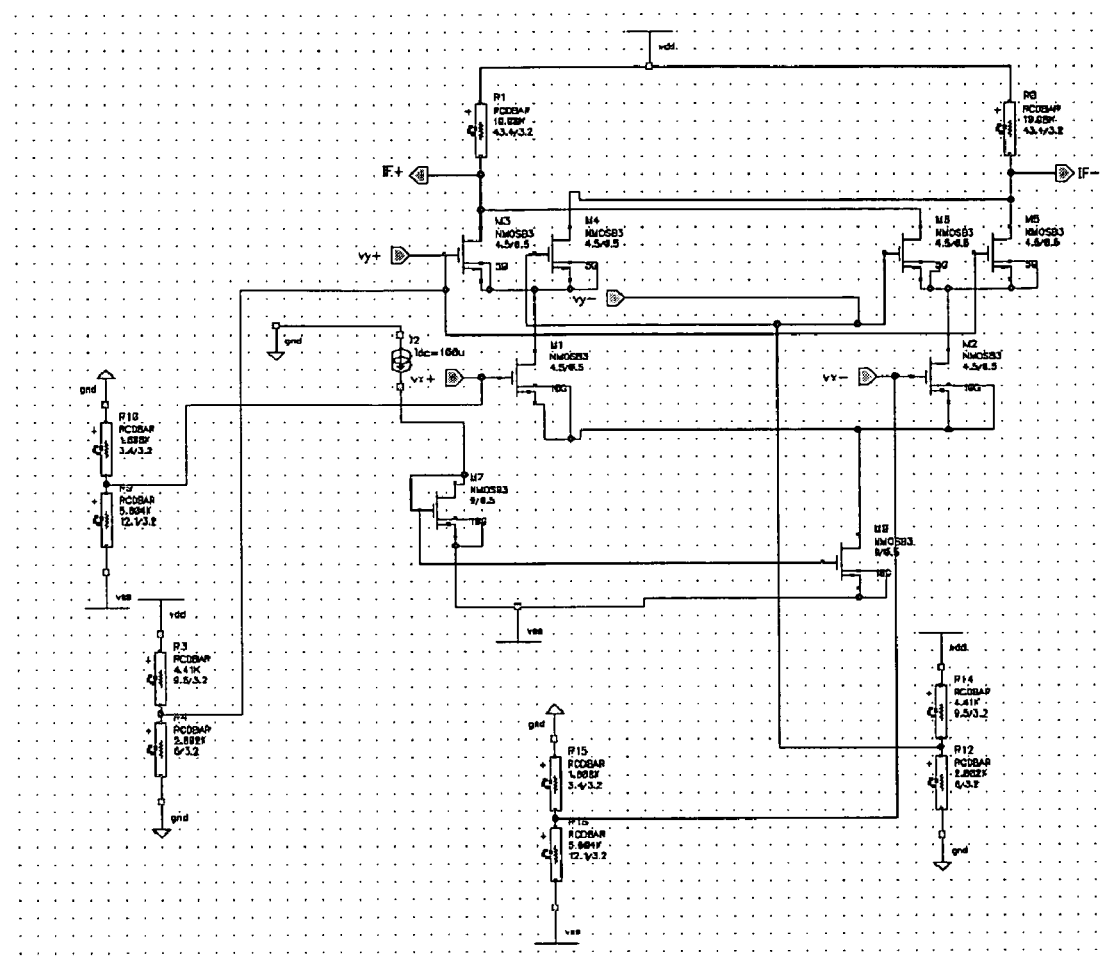
FIG. 19a is a diagram of a Doubly Balanced Gilbert cell Mixer in accordance with an embodiment of the present invention.
Figure 19B:
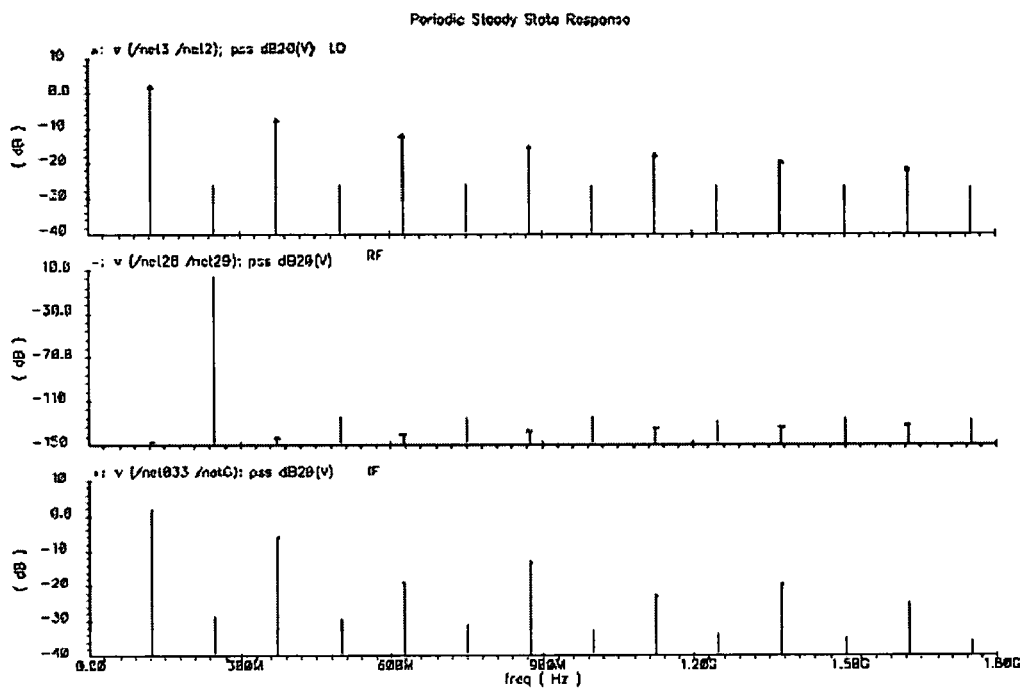
FIG. 19b is a graph showing the mixer simulation using periodic steady state simulation in accordance with an embodiment of the present invention.
Figure 19C:
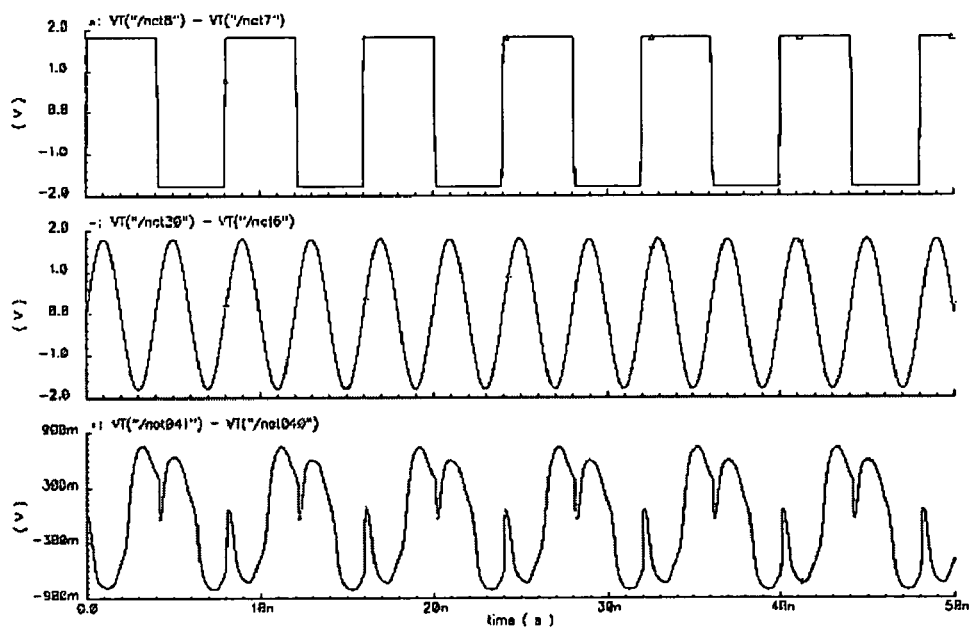
FIG. 19c is a graph of a mixer simulation showing generation of a BPSK signal in accordance with an embodiment of the present invention.

According to equation 4.1, mixer multiplies two sinusoids and generates their product by generating sum and difference of the frequencies. Several mixer designs can be used, from as simple as a two stacked transistor design, to a singly balanced Gilbert mixer to a more complex doubly balanced Gilbert mixer. One embodiment employs the doubly balanced mixer for use in the receiver section because of its good isolation and good common mode rejection in RF and LO because of its complete balanced design. FIG. 19a shows a doubly balanced Gilbert cell mixer. FIG. 19b shows the output of the Gilbert mixer using periodic steady state simulation. FIG. 19c shows the simulation of the BPSK generation using the Gilbert mixer for the SSTDR system. The simulation shows the mixer is functioning as expected.

Op-Amp as Differential to Single Ended Signal Converter

Figure 20A:
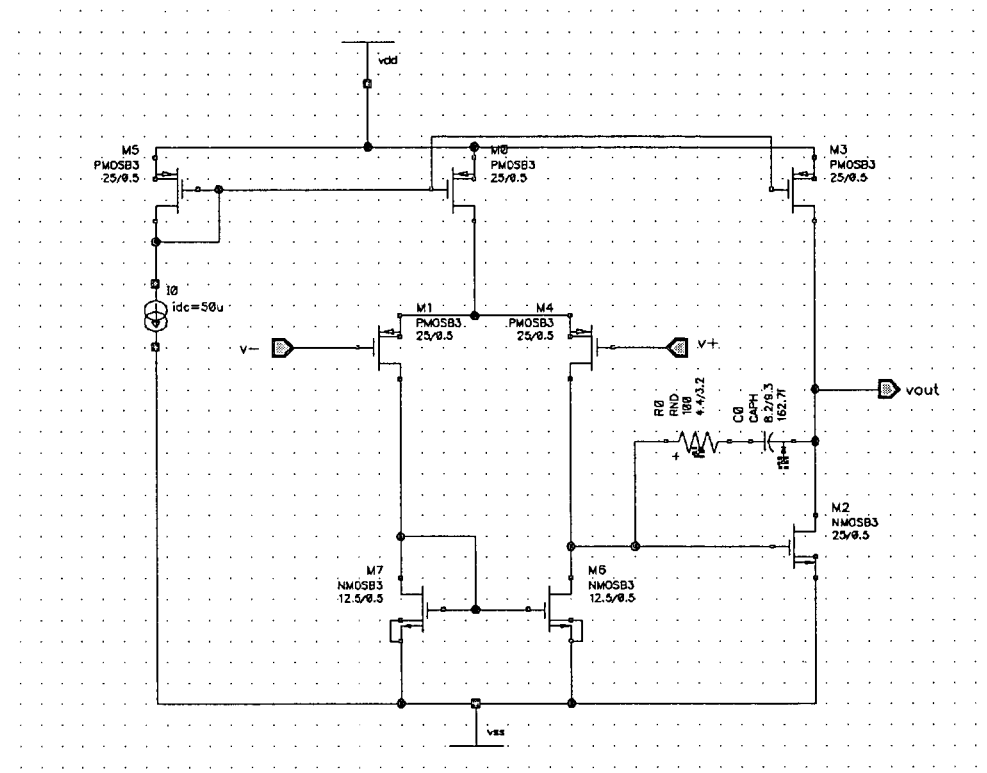
FIG. 20a is a diagram of an OP-amp circuit in accordance with an embodiment of the present invention.
Figure 20B:
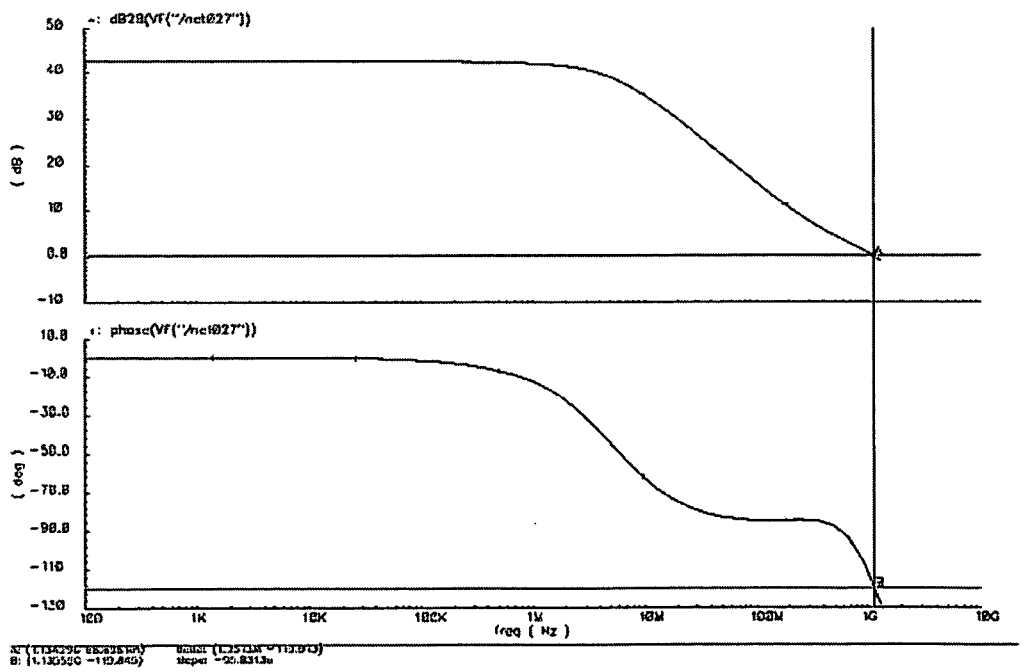
FIG. 20b is a graph showing AC simulation of an Op-amp in accordance with an embodiment of the present invention.

An op-amp was designed to convert the differential output of the mixer to a single ended output for the input of the integrator. The op-amp was designed to have small size and low power, as no gain (unity gain) was required. The phase margin and unity gain bandwidth were tested to ensure its operation. FIG. 20*a* shows the op-amp circuit. FIG. 20*b* shows the AC simulation of the op-amp showing its unity gain bandwidth of 1.13 GHz and phase margin of 61°. The op-amp as a unity gain amplifier is used for differential-to-single-ended conversion of the signal.

Integrator

Figure 21A:
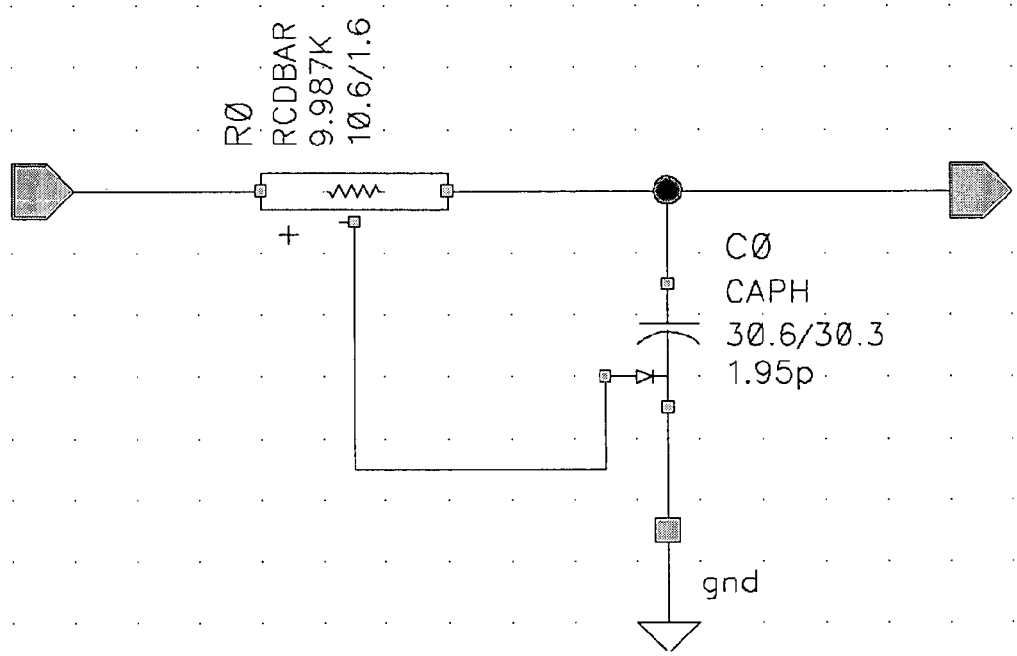
FIG. 21a is a diagram of an integrator circuit in accordance with an embodiment of the present invention.
Figure 21B:
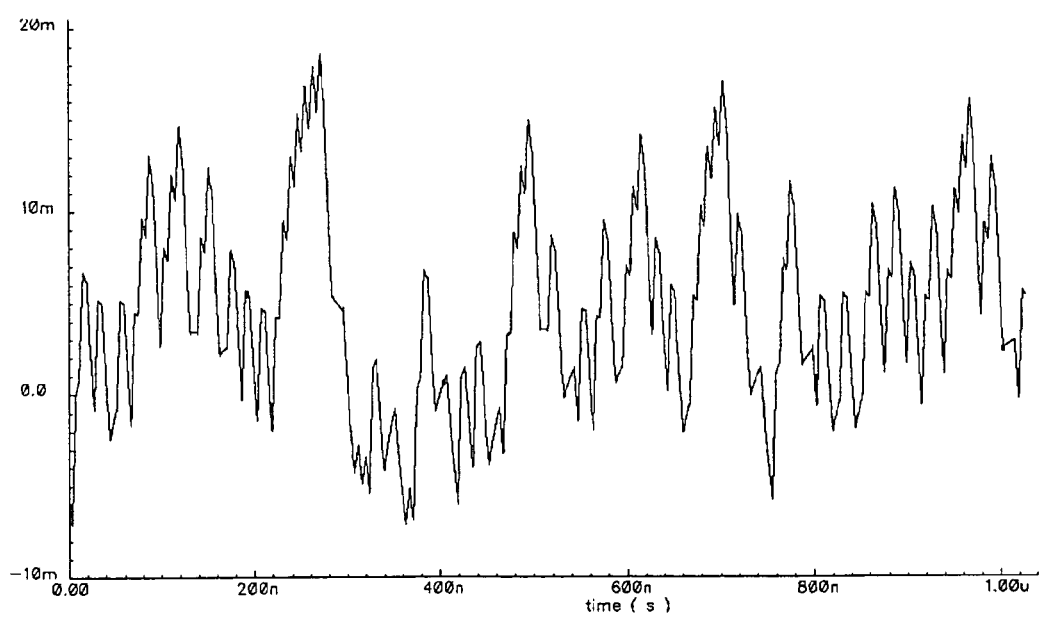
FIG. 21b is a graph showing simulation of an integrator in accordance with an embodiment of the present invention.

There are several different ways to integrate a signal. The methods that were considered for this design include an op-amp or RC integrator. The RC integrator was selected for one embodiment, because the op-amp integrator runs constant current, which increases its power consumption. FIG. 21*a* shows the integrator circuit, and FIG. 21*b* shows the simulation test from a train of square pulses. The simulation shows that the integrator responds to every pulse well and does not saturate when a series of positive or negative pulses are integrated.

Putting it Together: STDR System

Figure 22:
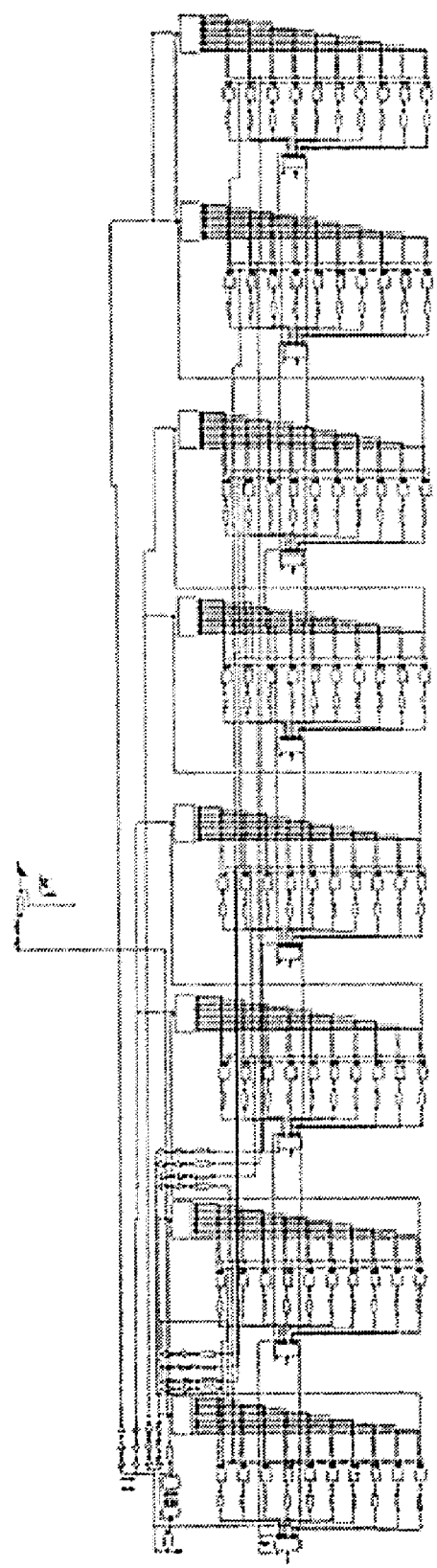
FIG. 22 is a diagram of an STDR System Circuit Diagram in accordance with an embodiment of the present invention.

After designing all the building blocks in the transmitter and receiver sub-sections and simulating them, the STDR system was ready to put together. All blocks are combined as shown in FIG. 7 to assemble the STDR system. The circuit diagram of one embodiment of the STDR system is shown in FIG. 22. The circuit diagram shows the 1 GHz clock being divided by the frequency divider which drives the PN sequence generator and counter. The counter feeds into the decoding logic, which generates a "Start" pulse indicating the start of a new correlation cycle. The PN sequence generator reloads the new seed with the start pulse and restarts its PN sequence generation. The PN sequence generator goes to the output drivers driving the test wires and the sub-chip sampler. A clipper is placed at the output to clip the signal to 17.5 dB below the signal level of the Mil-std 1553 signal. The sub-chip sampler generates parallel shifted copies of the PN sequence, which are correlated using the mixer, amplifier, and integrator trio in the receiver with the reflected signal to locate the faults on the wire.

The SSTDR System

The SSTDR System is a variant of the STDR system that uses a BPSK modulated PN sequence as the test signal. The system configurations are similar as shown in FIG. 22. For the SSTDR, the PN sequence generator output goes to the mixer before going to the output driver. The sub-chip sampler output also goes to the mixer to generate shifted copies of the BPSK modulated PN sequence on the transmitter side.

Simulation and Results

The analog circuit simulation of the STDR was performed to validate the design. The results of the simulation are given below. The simulation uses an analog simulation of the circuit whereas the test model used an attenuation-delay model for the transmission line.

Figure 23A:
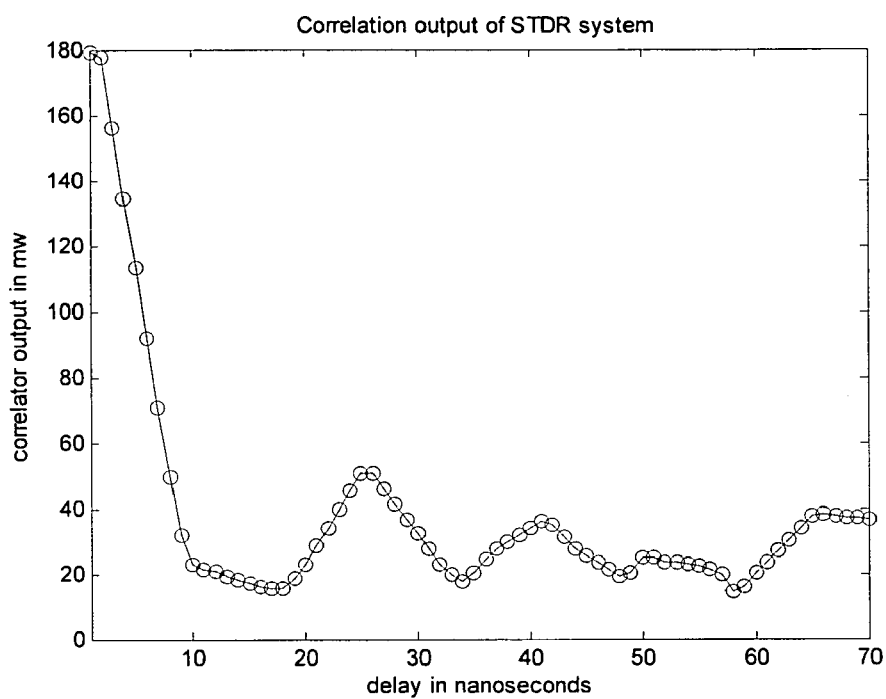
FIG. 23a is a graph showing correlation output of an STDR system with open circuit fault at delay zero in accordance with an embodiment of the present invention.
Figure 23B:
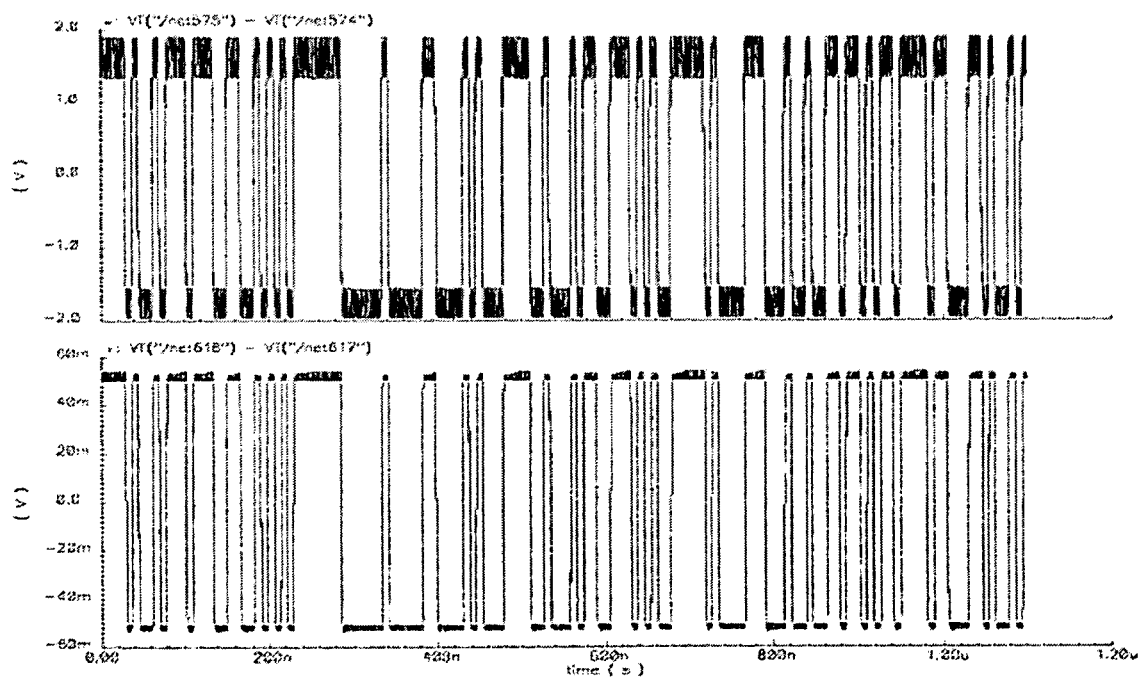
FIG. 23b is a graph showing PN sequence on top and a reflected signal on bottom in accordance with an embodiment of the present invention.

First the system was simulated for an open circuit fault with the delay set to 0. This is what would be seen if the test system was not connected to anything. The half correlation peak can be seen at zero location on the first correlator. The correlation output is shown in FIG. 23*a*. FIG. 23*b* shows the incident and reflected PN signals. It should be noted that the reflected PN signal has an amplitude of 140 mV p-p, Yet the system does find the fault with SNR of 3.086 or 9.789 dB. This shows the processing gain inherent in using a PN sequence, and is one of the advantages of using a PN sequence as a test signal.

Figure 24A:
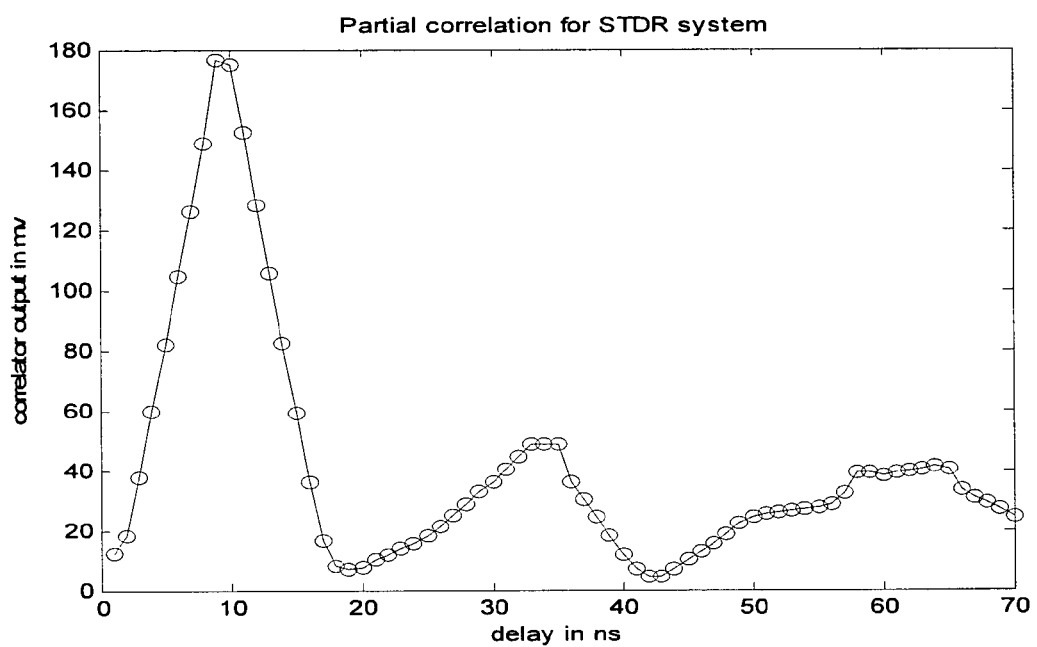
FIG. 24a is a graph showing partial correlation with an open circuit delay of 9 ns in accordance with an embodiment of the present invention.
Figure 24B:
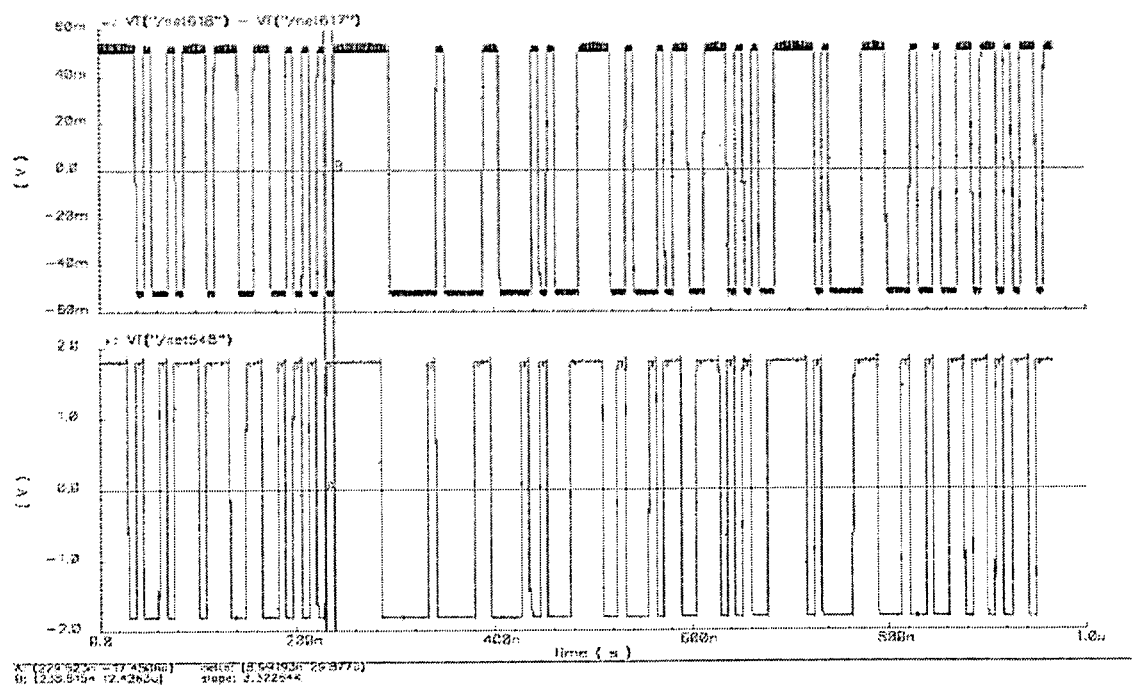
FIG. 24b is a graph showing a PN sequence on bottom and a reflected signal on top in accordance with an embodiment of the present invention.

FIG. 24*a* shows the correlation result for an open circuit fault simulated at a delay of 9 ns (3.6 meters). The correlation in this case was not done for the full period of the PN sequence. Only 90% of the PN sequence was correlated. This correlation was done only 90% not by design but by accident, but this showed that without full correlation still a peak can be detected. The simulation shows a higher noise floor than the previous figure, but the signal-to-noise ratio is still within acceptable limits and the correlation peak is found at the correct location. FIG. 24*b* shows the PN sequence and reflected signal with a delay of 8.99 ns.

Figure 25A:
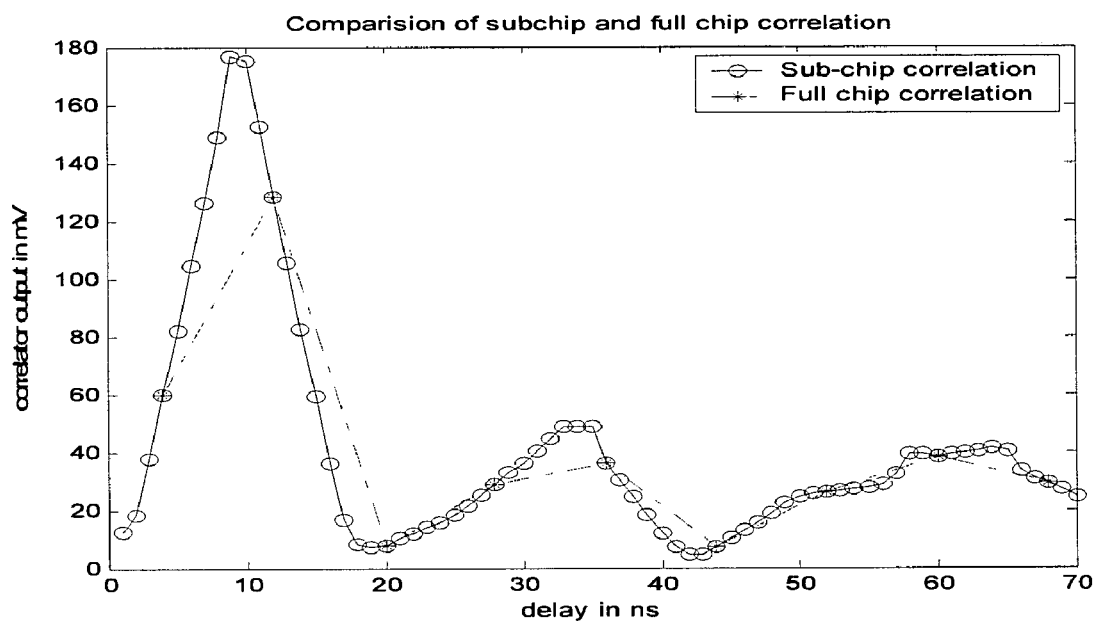
FIG. 25a is a graph showing a fault location with and without sub-chip correlation for an open circuit fault with a 9 ns delay in accordance with an embodiment of the present invention.
Figure 25B:
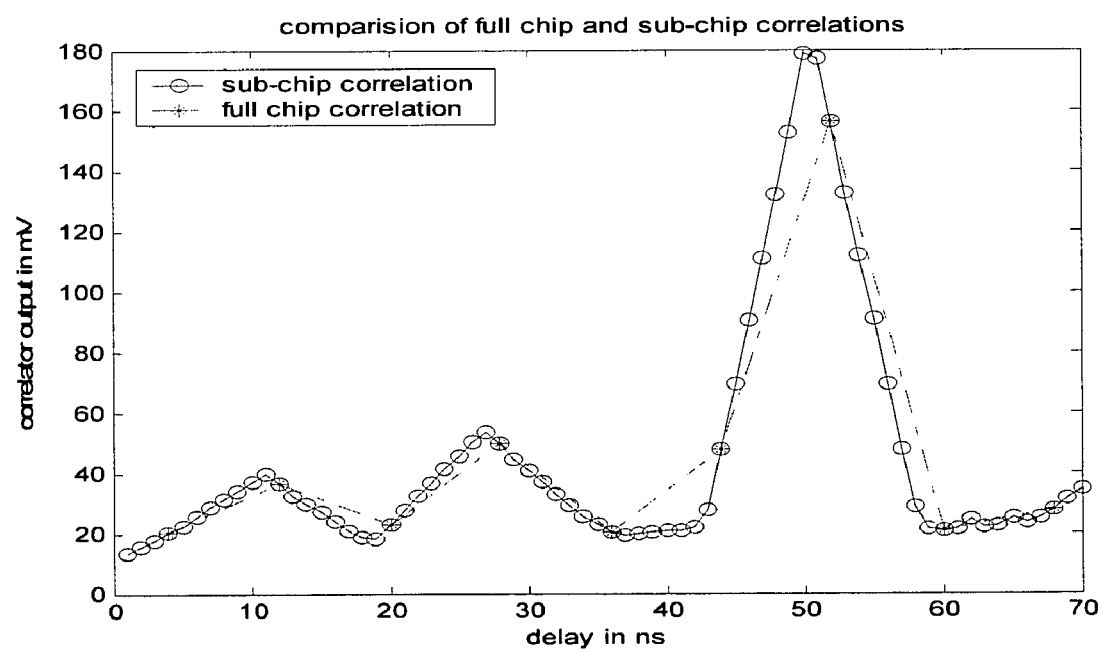
FIG. 25b is a graph showing a fault location with and without sub-chip correlation for open circuit fault with a 50 ns delay in accordance with an embodiment of the present invention.

The results also show the sub-chip correlation capability and the improvement in results due to sub-chip correlation. FIG. 25*a* shows correlation peaks for delays with and without sub-chip correlation for the FIG. 24*a* where an open circuit fault is located at a delay of 9 ns. We clearly see that without sub-chip correlation, the SNR is poor, and the position of the peak is shifted (it is at 12 ns in this case). This significantly reduces the accuracy which requires more extensive visual inspection and increases the cost of repairing old and damaged wiring. The same case is repeated in FIG. 25*b* where an open circuit fault with 50 ns delay is simulated with sub-chip and full chip correlation. Again, sub-chip correlation improves the accuracy of the detection system.

An additional delay can be inserted before the sub-chip sampler which can enable windowed correlation. In one embodiment, a delay loop can be inserted. The delay loop can be comprised of a counter and one or more flip-flops. The counter can delay the PN code by a predetermined amount. For example, the counter can be clocked using the system clock. Assuming there are 80 parallel correlators on the processor, the PN code can be delayed for 80 clock cycles, effectively shifting the correlation by 80 ns for a 1 GHz system clock. The correlation can be performed as previously discussed at the delayed window. The window can then be shifted by another 80 clock cycles using the delay loop, and so forth. This can enable the processor to be used in measuring.

The delay loop may also be clocked at a different rate than the system clock. In one embodiment the delay loop can be clocked by the sub-chip clock. For example, the delay loop can be clocked at 125 MHz while the system clock operates at 125 MHz. The PN code sequence can then be delayed by 10 clock cycles, allowing the window to move by 10 chips, or 80 system clock cycles. The 10 chips can then be over-sampled as previously discussed.

Figure 26:
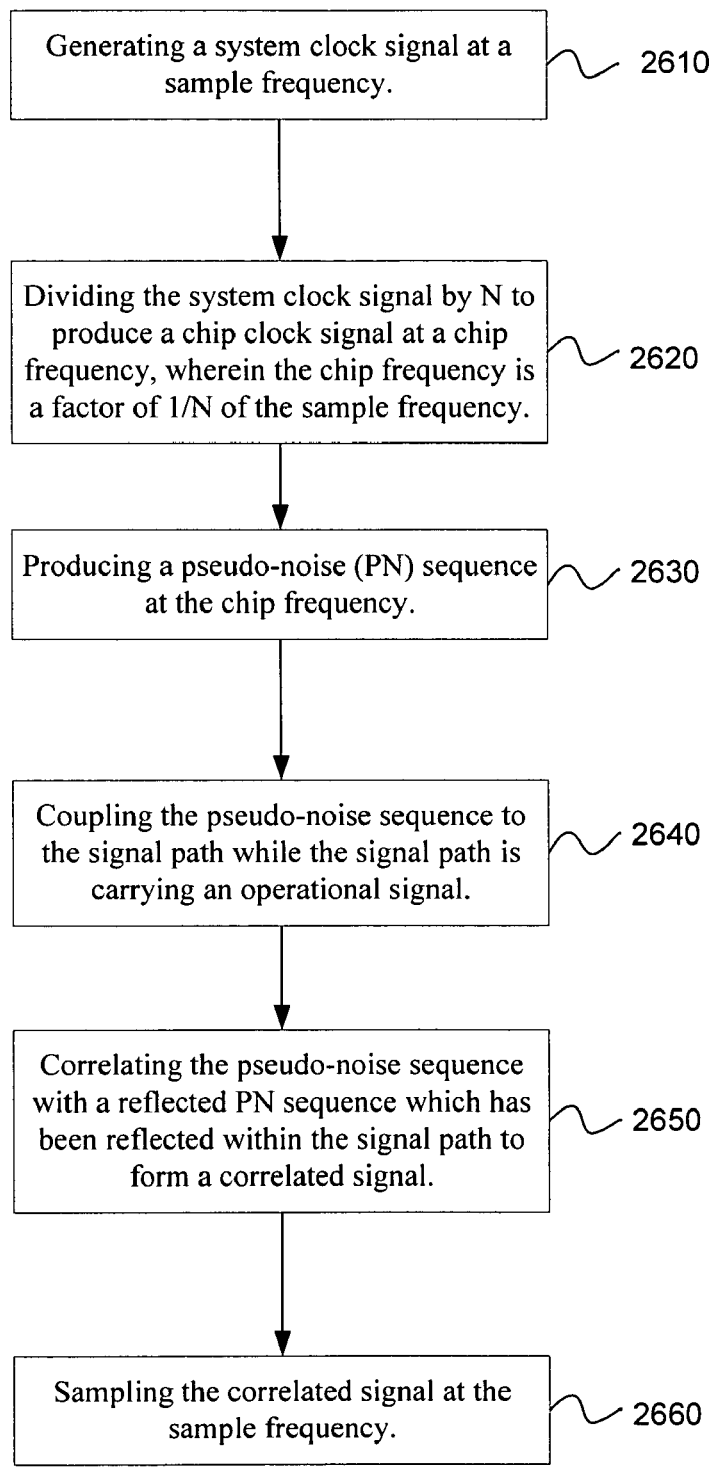
FIG. 26 is a flow chart depicting a method for characterizing a signal path.

Another embodiment comprises a method for characterizing a signal path as disclosed in the flow chart of FIG. 26. The method can include the operation of generating a system clock signal at a sample frequency, as shown in block 2610. A further operation includes dividing the system clock frequency by N to produce a chip clock signal at a chip frequency, wherein the chip frequency is a factor of 1/N of the sample frequency, as shown in block 2620. Another operation includes producing a pseudo-noise sequence at the chip frequency, as shown in block 2630. A further operation involves coupling the pseudo-noise sequence to the signal path while the signal path is carrying an operational signal, as shown in block 2640. Another operation includes correlating the pseudo-noise sequence with a reflected PN sequence which has been reflected within the signal path to form a correlated signal, as shown in block 2650. A further operation involves sampling the correlated signal at the sample frequency, as shown in block 2660.

There has long been a need to detect and locate faults as they occur in live wiring, especially in critical powered systems such as on airplanes. Designing the sequence time domain reflectometry (STDR) and spread spectrum time domain reflectometry (SSTDR) techniques for an ASIC has provided surprising and beneficial results. The ASIC design includes several novel features to enable it to evaluate sub-chip correlation. These include sub-chip correlation, a novel sub-chip sampler based on tapped delays, up-sampling of PN sequence by a predetermined amount to improve accuracy and resolution, parallel correlation, windowed correlation, and the compatibility to integrate sliding windowed correlation. The architecture also provides correlation in minimal possible time. The architecture can also incorporate various delay methods researched such as two parallel sub-chip samplers.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A system for characterizing a signal path, comprising:
   a system clock configured to produce a system clock signal at a sample frequency;
   a frequency divider configured to divide the sample frequency of the system clock signal by a factor of N to produce a chip clock signal at a chip frequency;
   a pseudo-noise (PN) sequence generator configured to produce a PN sequence at the chip frequency and couple the PN sequence to the signal path while the signal path is carrying an operational signal; and
   a sub-chip sampler configured to correlate the PN sequence and a reflected PN sequence which has been reflected within the signal path to form a correlated signal and to sample the correlated signal at the sample frequency.

2. A system as in claim 1, wherein the PN sequence generator is configured to be programmable to enable the PN sequence generator to produce two or more types of PN sequences.

3. A system as in claim 2, wherein the PN sequence generator is configured to be programmed to produce a maximal length PN code.

4. A system as in claim 2, wherein a seed logic is fed to an initial state of the PN sequence generator.

5. A system as in claim 1, wherein the sub-chip sampler further comprises a shift register configured to shift the PN-sequence by one sub-chip each cycle of the system clock signal.

6. A system as in claim 5, wherein the shift register is comprised of a plurality of D type flip-flops.

7. A system as in claim 1, wherein the sub-chip sampler further comprises a surface acoustic wave structure configured to delay the PN-sequence by one or more sub-chip cycles.

8. A system as in claim 1, wherein the sub-chip sampler further comprises a means for multiplying the reflected PN sequence with the PN sequence.

9. A system as in claim 8, wherein the means for multiplying is a radio frequency mixer.

10. A system as in claim 9, wherein the mixer is a doubly balanced Gilbert mixer.

11. A system as in claim 9, wherein the sub-chip sampler further comprises an operational amplifier (op-amp) configured to receive a differential output of the mixer and convert it to a single ended signal.

12. A system as in claim 11, wherein the sub-chip sampler further comprises a means for integrating the single ended signal to output a correlated signal.

13. A system as in claim 12, wherein the sub-chip sampler further comprises a peak detector configured to receive the correlated signal and detect a peak in the signal, wherein the peak signifies a discontinuity in the signal path.

14. A system as in claim 12, further comprising a plurality of correlation sections comprising the mixer, the operational amplifier, and the integration means.

15. A system as in claim 1, wherein the PN sequence is modulated by a carrier signal to generate a binary phase shift keying (BPSK) signal to be coupled to the signal path while the signal path is carrying an operational signal.

16. A system as in claim 1, wherein the PN sequence generator is configured to generate the PN-sequence at a power level below a noise floor of the signal path.

17. A system as in claim 1, wherein the system clock is configured to operate at a frequency of approximately 1 GHz.

18. A system as in claim 1, wherein the chip clock is configured to operate at a frequency of approximately 125 MHz.

19. A system as in claim 1, wherein the sub-chip sampler further comprises a delay located before the sub-chip sampler and configured to delay a PN-code sequence by a predetermined amount of time to enable the system to characterize a desired portion of the signal path.

20. A system for characterizing a signal path, comprising
   a system clock configured to produce a system clock signal at a sample frequency;
   a frequency divider configured to divide the sample frequency of the system clock signal by a factor of N to produce a chip clock signal at a chip frequency;
   a pseudo-noise (PN) sequence generator configured to produce a PN sequence at the chip frequency and couple the PN sequence to the signal path while the signal path is carrying an operational signal;
   a sub-chip sampler configured to correlate the PN sequence with a reflected PN sequence, which has been reflected within the signal path, to produce a correlated signal and sample the correlated signal at the sample frequency, wherein the sub-chip sampler further comprises:
   a shift register configured to shift the PN sequence relative to the reflected PN sequence by one sub-chip each cycle of the system clock;
   a means for multiplying the reflected PN sequence with the PN sequence to produce the correlated signal; and
   a means for integrating the correlated signal.

21. A system as in claim 20, wherein the means for multiplying the reflected PN sequence with the PN sequence comprises a radio frequency mixer.

22. A system as in claim 20, wherein the means for integrating correlated signal comprises an RC integrator.

23. A system as in claim 20, further comprising a peak detector configured to locate a peak within the correlated signal, wherein the peak signifies a discontinuity in the signal path.

24. A method for characterizing a signal path, comprising the steps of:
generating a system clock signal at a sample frequency;
dividing the system clock frequency by N to produce a chip clock signal at a chip frequency, wherein the chip frequency is a factor of 1/N of the sample frequency;
producing a pseudo-noise (PN) sequence at the chip frequency;
coupling the pseudo-noise sequence to the signal path while the signal path is carrying an operational signal;
correlating the pseudo-noise sequence with a reflected PN sequence which has been reflected within the signal path to form a correlated signal; and
sampling the correlated signal at the sample frequency.

* * * * *